(12) United States Patent
Bandyopadhyay et al.

(10) Patent No.: US 8,946,678 B2
(45) Date of Patent: Feb. 3, 2015

(54) ROOM TEMPERATURE NANOWIRE IR, VISIBLE AND UV PHOTODETECTORS

(71) Applicant: Virginia Commonwealth University, Richmond, VA (US)

(72) Inventors: Supriyo Bandyopadhyay, Glen Allen, VA (US); Saumil Bandyopadhyay, Glen Allen, VA (US); Pratik Agnihotri, Richmond, VA (US)

(73) Assignee: Virginia Commonwealth University, Richmond, VA (US)

( * ) Notice: Subject to any disclaimer, the term of this patent is extended or adjusted under 35 U.S.C. 154(b) by 0 days.

(21) Appl. No.: 13/803,185

(22) Filed: Mar. 14, 2013

(65) Prior Publication Data

US 2013/0240837 A1    Sep. 19, 2013

Related U.S. Application Data

(60) Provisional application No. 61/611,047, filed on Mar. 15, 2012.

(51) Int. Cl.
*H01L 31/00* (2006.01)
*H01L 31/0352* (2006.01)
(Continued)

(52) U.S. Cl.
CPC ........ *H01L 31/035236* (2013.01); *H01L 31/18* (2013.01); *H01L 31/035227* (2013.01);
(Continued)

(58) Field of Classification Search
CPC ......... H01L 31/18; H01L 22/10; H01L 22/12; H01L 22/24; H01L 23/5258; H01L 27/14643; H01L 31/0236; H01L 31/03923; H01L 31/06; H01L 31/1804; H01L 51/0069; H01L 51/0072; H01L 51/008; H01L 51/0093

USPC ........ 257/9, 21, 440, 786, E31.043, E31.047; 438/98, 457, 487

See application file for complete search history.

(56) References Cited

U.S. PATENT DOCUMENTS 7,501,611 B2    3/2009    Mizuno et al.
7,566,435 B2    7/2009    Chen et al.
(Continued)

OTHER PUBLICATIONS

Bandyopadhyay, S. et al., Electrochemically assembled quasi-periodic quantum dot arrays, Nanotechnology 7, 1996, 360.
(Continued)

*Primary Examiner* — Mark A Laurenzi
(74) *Attorney, Agent, or Firm* — New River Valley IP Law, PC; Michele L. Mayberry

(57) ABSTRACT

Room temperature IR and UV photodetectors are provided by electrochemical self-assembly of nanowires. The detectivity of such IR detectors is up to ten times better than the state of the art. Broad peaks are observed in the room temperature absorption spectra of 10-nm diameter nanowires of CdSe and ZnS at photon energies close to the bandgap energy, indicating that the detectors are frequency selective and preferably detect light of specific frequencies. Provided is a photodetector comprising: an aluminum substrate; a layer of insulator disposed on the aluminum substrate and comprising an array of columnar pores; a plurality of semiconductor nanowires disposed within the pores and standing vertically relative to the aluminum substrate; a layer of nickel disposed in operable communication with one or more of the semiconductor nanowires; and wire leads in operable communication with the aluminum substrate and the layer of nickel for connection with an electrical circuit.

22 Claims, 21 Drawing Sheets

A semiconductor nanowire tunnel detector.

(51) Int. Cl.
  *H01L 31/18* (2006.01)
  *H01L 31/09* (2006.01)
  *H01L 31/101* (2006.01)
  *H01L 31/109* (2006.01)
  *H01L 21/02* (2006.01)

(52) U.S. Cl.
  CPC .............. *H01L31/09* (2013.01); *H01L 31/101* (2013.01); *H01L 31/109* (2013.01); *H01L 31/1836* (2013.01); *H01L 21/02425* (2013.01); *H01L 21/02488* (2013.01); *H01L 21/02513* (2013.01); *H01L 21/02557* (2013.01); *H01L 21/0256* (2013.01); *H01L 21/02562* (2013.01); *H01L 21/02603* (2013.01); *H01L 21/02639* (2013.01); *Y02E 10/50* (2013.01)
  USPC .......... 257/21; 257/9; 257/440; 257/E31.043; 438/98; 438/457; 438/487

(56) References Cited

U.S. PATENT DOCUMENTS

| | | | |
|---|---|---|---|
| 7,608,902 | B2 | 10/2009 | Kwon et al. |
| 7,635,600 | B2 | 12/2009 | Zhang et al. |
| 7,651,944 | B2 | 1/2010 | Duan et al. |
| 7,691,201 | B2 | 4/2010 | Kamins et al. |
| 7,892,956 | B2 | 2/2011 | Deligianni et al. |
| 7,906,361 | B2 | 3/2011 | Kim et al. |
| 7,989,753 | B2 | 8/2011 | Mizuno et al. |
| 8,203,195 | B2 | 6/2012 | Ivanov et al. |
| 8,313,972 | B2 | 11/2012 | Kim et al. |
| 2007/0155173 | A1 | 7/2007 | Chen et al. |
| 2008/0178924 | A1 | 7/2008 | Kempa et al. |
| 2010/0002324 | A1 | 1/2010 | Rozhin et al. |
| 2010/0147674 | A1 | 6/2010 | Krivoshlykov |
| 2010/0239488 | A1 | 9/2010 | Zettl et al. |
| 2010/0320444 | A1* | 12/2010 | Dutta ............................ 257/21 |
| 2011/0108803 | A1 | 5/2011 | Deligianni et al. |
| 2012/0138901 | A1 | 6/2012 | Walker et al. |

OTHER PUBLICATIONS

Bandyopadhyay, Saumil et al., "A self assembled room temperature nanowire infrared photodetector based on quantum-mechanical wavefunction engineering," Physica E, 44, 1478, 2012.

Bandyopadhyay, Saumil et al., "Signature of quasi one-dimensionality in the absorption spectra of electrochemically self-assembled nanowires," Physica E, 43, 1255-1261, 2011.

Bockelmann, U. and Bastard, G., Interband absorption in quantum wires. I. Zero-magnetic-field case, Physical Review B, 45, 1688-1699 (1992).

Jayaweera, P. V. V. et al., Uncooled infrared detectors for 3-5μm and beyond, Applied Physics Letters, 93, 021105 (2008).

Kouklin, N. et al., Giant photoresistivity and optically controlled switching in self-assembled nanowires, Applied Physics Letters, 79, 4423-4425 (2001).

Kumar, S., Sharma, S.K., Growth and characterization of large-scale uniform Zinc Sulfide nanowires by a simple chemical reaction technique. Superlattices and Microstructures, 46, 2009, 687-692.

Martin, C. R., Nanomaterials: A Membrane-Based Synthetic Approach, Science, 266, 1961-1966 (1994).

Masuda, H. and Satoh, M., Fabrication of Gold Nanodot Array Using Anodic Porous Alumina as an Evaporation Mask, Jpn. J. Appl. Phys., vol. 35 Pt. 2, 1996, L126-L129.

Mondal, S.P. et al., Characteristics of CdS nanowires grown in a porous alumina template using a two-cell method, Nanotechnology 18, 2007, 095606.

Mondal, S.P. et al., Manuscript for "Template Assisted Growth of Aligned CdSe Nanowires by DC Electrochemical Process", in: Proceedings of the International Workshop on Physics of Semiconductor Devices, Mumbai, India, Dec. 16-20, 2007.

Pokalyakin, V. et al., Proposed model for bistability in nanowire nonvolatile memory, Journal of Applied Physics, 97, 124306 (2005).

Rabin, O. et al., Formation of Thick Porous Anodic Alumina Films and Nanowire Arrays on Silicon Wafers and Glass, Advanced Functional Materials, Aug. 2003, vol. 13, No. 8, p. 631-638.

Rakovska, A. et al., Room temperature InAsSb photovoltaic midinfrared detector, Appl. Phys. Lett., 77, 397 (2000).

Ramanathan, S., et al., Fluorescence and infrared spectroscopy of electrochemically self assembled ZnO nanowires: evidence of the quantum confined Stark effect, J. Mater. Sci. Mater. Electron.17 (2006) 651.

Ricker, R. E. et al., Nanofabrication of a Quantum Dot Array: Atomic Force Microscopy of Electropolished Aluminum, Journal of Electronic Materials, vol. 25, No. 10, 1996.

Tsu, R. and Esaki, L., Tunneling in a finite superlattice, Applied Physics Letters, vol. 22, 562 (1973).

* cited by examiner

Principle of photodetection in a semiconductor.

Spatial extents of the wavefunctions in the conduction band and trap states.

Energy band alignment of semiconductor and insulator showing the relative energy position of the trap levels.

A semiconductor nanowire tunnel detector.

Electron energy band diagram around the tunnel barrier for the structure shown in FIG. 3.

Scanning electron micrograph of porous alumina film formed by anodization of aluminum in oxalic acid.

Field emission scanning electron micrograph of a porous alumina film with a pore diameter of about 10 nm.

Schematic of the structure shown in FIG. 8A.

Cross-section field emission scanning electron micrograph showing nanowires partially filling pores.

Graph of energy dispersive X-ray (EDAX) data of CdS nanowire

Energy dispersive X-ray data for graph of FIG. 9A

Scanning electron micrograph showing pores overfilled with semiconductor.

Graph of energy dispersive X-ray analysis of CdSe nanowire.

Energy dispersive X-ray data for graph of FIG. 12A.

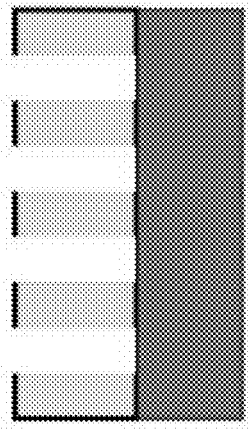
FIG. 13C
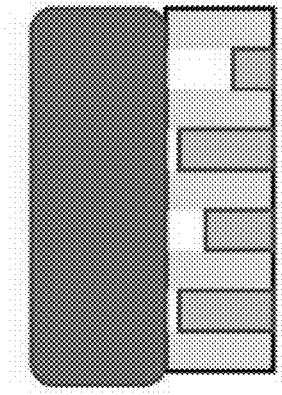
FIG. 13F
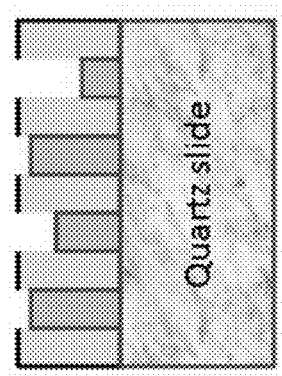
FIG. 13H
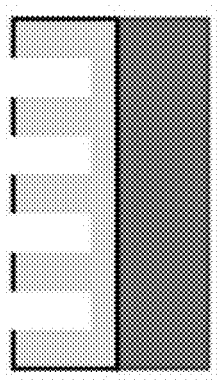
FIG. 13B
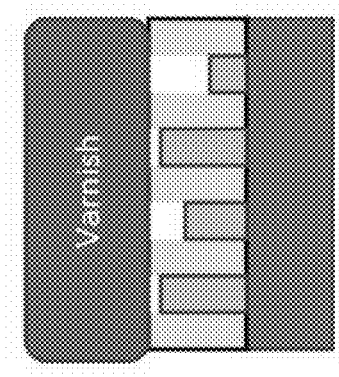
FIG. 13E
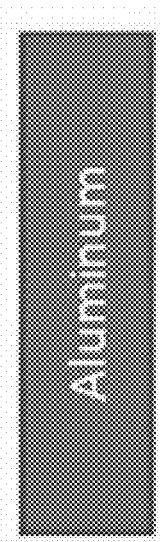
FIG. 13A
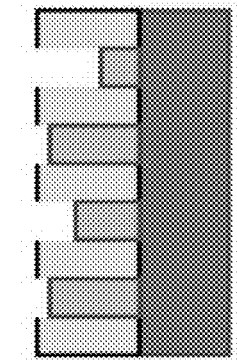
FIG. 13D
FIG. 13G IR absorption spectrum of 50-nm diameter CdS nanowire.

IR absorption spectrum of 50-nm diameter CdSe nanowire.

Current-voltage characteristic of the tunnel detector in the dark and under IR illumination at room temperature.

FIGS. 16A-B

Current-voltage characteristic of 50 nm diameter CdS nanowire photodetectors in the dark and under illumination by IR or UV lamp.

Room-temperature absorption spectrum of CdSe nanowires formed within 10-nm diameter pores of anodic alumina films.

Room-temperature absorption spectrum of ZnS nanowires formed within 10-nm diameter pores of anodic alumina films.

Room-temperature absorption spectrum of CdTe nanowire samples.

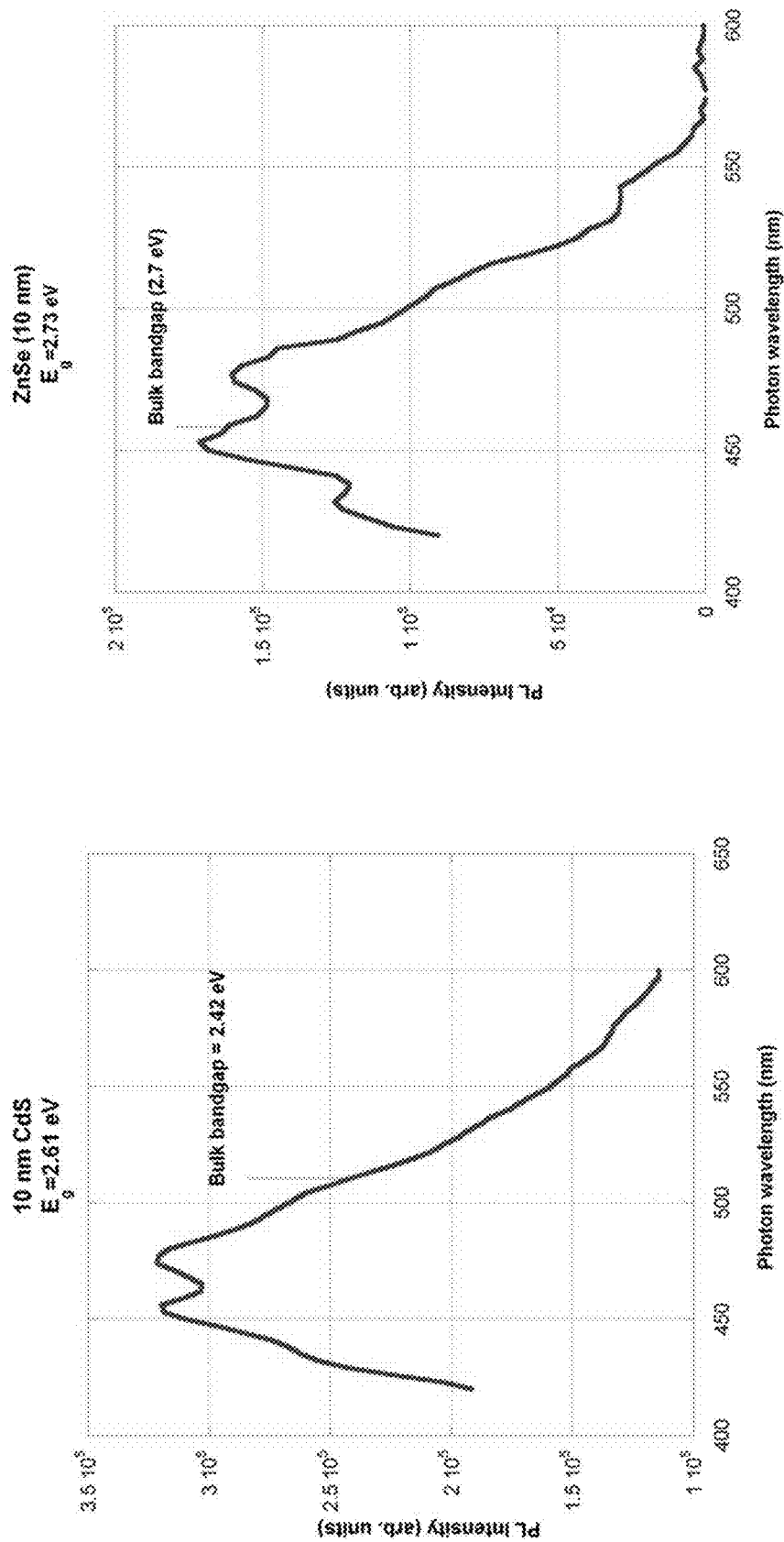
FIGS. 20A-B
Photoluminescence spectra of nanowires taken with an He-Ne laser.

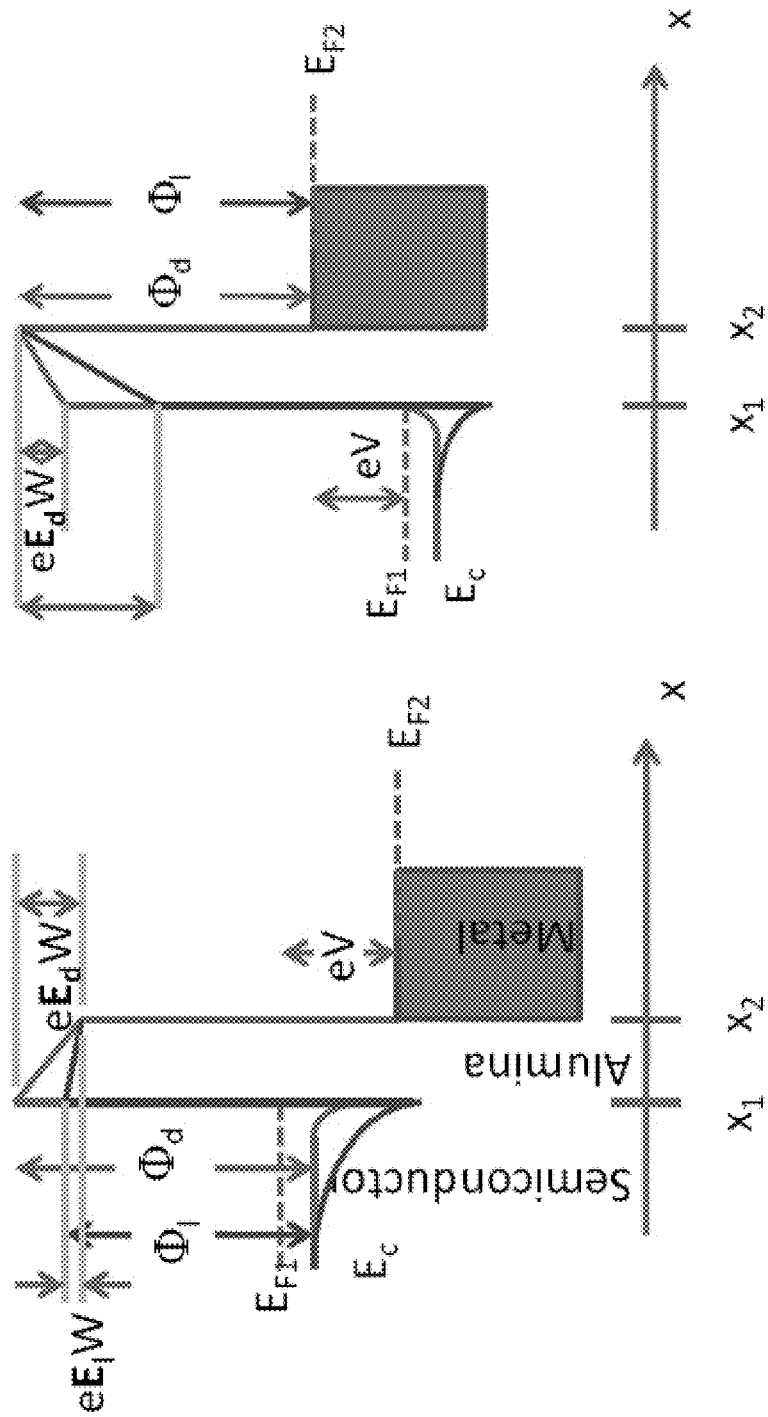

ROOM TEMPERATURE NANOWIRE IR, VISIBLE AND UV PHOTODETECTORS

CROSS REFERENCE TO RELATED APPLICATIONS

This application claims priority to and the benefit of the filing date of U.S. Provisional Application No. 61/611,047, filed Mar. 15, 2012, the disclosure of which is hereby incorporated by reference herein in its entirety.

BACKGROUND OF THE INVENTION

1. Field of the Invention

The present invention relates to the field of photodetectors. Embodiments of the present invention provide room temperature IR, visible and UV photodetectors that incorporate wavefunction engineering and/or photomodulated electron tunneling. They are made by electrochemical self-assembly of nanowires. Photodetectors of embodiments of the invention have an infrared (wavelength averaged) detectivity exceeding $10^7$ cm-($\sqrt{Hz}$)/watt at room temperature.

2. Description of Related Art

A photodetector is a device that senses light by producing an electrical current under illumination. The onset of this current signals the presence of light. Infrared (IR) photodetectors are widely used in car collision avoidance systems, detection of buried mines, night vision, forensics, search for water in the moon and extra-solar planets, formation of stellar nurseries, missile defense, and analytical chemistry to name a few. Ultra-violet (UV) photodetectors are used for fire and explosion detection, UV exposure detection, chemical-related chromatography applications, such as High Performance Liquid Chromatography (HPLC), astronomy and missile defense. Visible light detectors are used in forensics and analytical chemistry.

The best photodetectors are typically made of semiconductors. They work by absorbing an incident photon that excites an electron from the valence band ($E_v$) to the conduction band ($E_c$) of the semiconductor leaving behind a hole (electron vacancy) in the valence band, as shown in FIG. 1. Both the electron and the hole can carry current. Thus, the absorption of the photon generates an electron-hole pair that causes an additional amount of current to flow through the detector if a potential bias is applied across it. This additional current signals the presence of the photon, thereby effectively "detecting" it. The only requirement for this mechanism to work is that the photon's energy hf (h=Planck constant and f=photon frequency) must exceed the energy separation between the conduction and the valence band, which is the semiconductor's bandgap $\Delta E$:

$$hf \geq \Delta E \quad \text{EQ. (1)}$$

This condition is mandated by the principle of energy conservation. Because of the requirement in Equation (1), IR detectors will need semiconductors of very small bandgap $\Delta E$ because IR photons have very small energies hf (typically a few milli-electron volts, or meV).

Typical IR detectors are indeed made of small-bandgap semiconductors like InSb and HgCdTe. However, if the semiconductor has a small bandgap, then phonons (quanta of lattice vibrations) can also excite electrons from the valence to the conduction band, since phonons have energies comparable to those of IR photons, and satisfy Equation (1). Therefore, current can flow through the detector even in the dark because of the phonons exciting electrons from the valence to the conduction band. The population of phonons increases rapidly with temperature because phonons obey Bose-Einstein statistics. At room temperature, the phonon population in a detector may vastly exceed the photon population in incident IR light. In that case, phonons would have already generated a large number of electron-hole pairs in the dark and the few additional pairs generated by IR light will make little difference to the pair population or the total current. In other words, the current under illumination by IR light $I_{light}$ will only slightly exceed the dark current $I_{dark}$. That will make the signal-to-noise ratio (SNR) of the detector only slightly larger than unity:

$$SNR = \frac{I_{light}}{I_{dark}} \cong 1. \quad \text{EQ. (2)}$$

A low signal-to-noise ratio severely impairs the detection ability of the detector since there is hardly any difference between the current flowing in the dark and current flowing under illumination. Therefore, it is imperative to increase the room-temperature signal-to-noise ratio and make it considerably exceed unity by clever engineering.

The easiest way to increase the signal to noise ratio is to cool the detectors with cryogens, which will reduce the phonon population and the dark current. However, there is a strong need for semiconductor infrared (IR) photodetectors that work at room temperature without cooling and yet has large signal-to-noise ratio because of the cost and inconvenience of cryogenic or Peltier cooling. Room temperature IR detectors with adequate signal-to-noise ratio are usually fashioned out of microbolometers, thermopiles or pyroelectric detectors, but they are expensive and fragile. See P. W. Kruse and D. D. Skatrud, *Uncooled Infrared Imaging Arrays and Systems*, (Academic, San Diego, 1997).

Rugged room-temperature IR detectors have been derived from semiconductor structures fabricated with expensive molecular beam epitaxy. See A. Rakovska, V. Berger, X. Marcadet, B. Vinter, G. Glastre, T. Oksenhendler and D. Kaplan, Appl. Phys. Lett., 77, 397 (2000); and P. V. V. Jayaweera, S. G. Matsik, A. G. U. Perera, H. C. Liu, M. Buchanan and Z. R. Wasilewski, Appl. Phys. Lett., 93, 021105 (2008). Such fabrication methods, however, are not amenable to high throughput and therefore not commercially viable. Examples of conventional detectors include those disclosed in U.S. Pat. Nos. 8,313,972, 8,203,195, 7,989,753, 7,906,361, and 7,501,611, and in US Published Patent Application Nos. 20120138901 and 20080178924. They are typically fabricated with expensive techniques that have slow throughput.

There is a recent report that millions of IR detectors will be required across the planet to monitor the effects of global warming. Such detectors must operate without cooling and must be robust, reliable, rugged, cheap and mass-producible with high throughput. Present detectors cannot meet this requirement because they are either too fragile, or too expensive, or do not have sufficient signal-to-noise ratio. The invented detector meets this requirement since it works at room temperature and is robust, rugged, cheap and mass-producible.

In addition to the low signal-to-noise ratio at room temperature, a serious shortcoming of most semiconductor photodetectors is that they are not frequency-selective, i.e. they cannot lock on to a specific frequency of light at the exclusion of all other frequencies. Thus, they cannot satisfy the requirement of frequency-resolved analysis of radiation which is important in astronomy, forensics and molecular spectroscopy. However, nanowire based photodetectors are naturally frequency-selective since they absorb (and therefore detect) light within a narrow window of frequency. This happens because the absorption spectrum of nanowires exhibit distinct peaks at specific frequencies and these frequencies can be tailored with appropriate choice of nanowire materials. The peaks are caused by the fact that electrons and holes in nanowires are constrained to move in only one dimension (along the length of the nanowire) and cannot move sideways. This is known as quasi one-dimensional carrier confinement. One-dimensional confinement leads to frequency-selectivity of absorption and hence detection.

Synthesizing nanowires that exhibit absorption peaks (and hence frequency selectivity) is remarkably difficult since the nanowire diameter has to be smaller than the thermal DeBroglie wavelength of electrons, which may be a few nanometers. Nanowires have been made by various processes, including such processes as disclosed in U.S. Pat. Nos. 7,892,956, 7,691,201, 7,651,944, 7,635,600, 7,608,902, and 7,566,435 and in US Published Patent Application Nos. 20110108803, 20100239488, 20100147674, 20100002324, and 20070155173. Not all of them exhibit absorption peaks and hence not all of them can be fashioned into frequency selective photodetectors.

Nanowires prepared by the "porous alumina template" technique where semiconductors are selectively electrodeposited in nanometer sized pores of anodic alumina films produced by anodizing an aluminum foil in oxalic or sulfuric acid [see C. R. Martin, Science, 266 (1994) 1961; and S. Bandyopadhyay, et al., Nanotechnology 7 (1996) 360] are desirable since the fabrication process is inexpensive and have a high throughput. However, such nanowires are usually polycrystalline, have a high density of surface states (see V. Pokalyakin, et al., J. Appl. Phys. 97 (2005) 124306) and are replete with impurities absorbed during synthesis. Consequently, they do not commonly exhibit absorption peaks. Current reports in the literature reveal that CdS and CdSe nanowires produced by this technique exhibit blue shifts in their absorption spectra, but the absorption strengths increase monotonically with photon energy (see S. P. Mondal, K. Das, A. Dhar, S. K. Ray, Nanotechnology 18 (2007) 095606; and S. P. Mondal, K. Das, A. Dhar, S. K. Ray, in: Proceedings of the International Workshop on Physics of Semiconductor Devices, Mumbai, India, 2007, p. 855), instead of exhibiting peaks. Such nanowires therefore cannot be fashioned into frequency-selective detectors. The invented electrochemically synthesized nanowires of CdSe and ZnS, exhibit absorption peaks and hence frequency selectivity at room temperature.

In order to devise an IR detector that does not require cooling and yet has an adequate signal-to-noise ratio (SNR), a new approach to photodetection was adopted. It is based on the following premise. The rate of transition of electrons from one energy-level $E_1$ to another $E_2$ in any material, due to either photons or phonons, is given by Fermi's Golden Rule:

$$S(E_1, E_2) = \frac{2\pi}{\hbar} |M_{E_1,E_2}|^2 \delta(E_2 - E_1 - \hbar\omega), \quad \text{EQ. (3)}$$

where $E_1$ is the lower energy level, $E_2$ is the higher energy level, and $M_{E_1,E_2}$ is the matrix element for transition between the two levels, which is a measure of the strength of coupling between electrons and either photons or phonons. Coupling induces the transition from level $E_1$ to $E_2$.

Matrix element for electron-photon coupling is given by:

$$M_{elec\text{-}photon} \propto N_{photon} |\int \psi^*_2(r) e^{ik\cdot r} [-i\hbar e_v \cdot \nabla \psi_1(r)] d^3 r|^2, \quad (4)$$

where $N_{photon}$ is the photon occupation number that depends on the incident light intensity, $e_v$ is the unit vector in the direction of light polarization, k is the photon's wavevector, $\psi_1(r)$ is the initial state wavefunction in level $E_1$ and $\psi_2(r)$ is the final state wavefunction in level $E_2$. On the other hand, the electron-phonon coupling strength is:

$$M_{elec\text{-}photon} \propto N_{phonon} |\int \psi^*_2(r) e^{ik\cdot r} \psi_1(r) d^3 r|^2, \quad \text{EQ. (5)}$$

where $N_{phonon}$ is the phonon occupation number. At equilibrium, it is given by the Bose-Einstein factor $$\left( N_{phonon} = 1 \middle/ \left[ \exp\left(\frac{\hbar\omega_{phono}}{kT}\right) - 1 \right] \right).$$

Normally, $N_{phonon} \gg N_{photon}$ at room temperature, which makes the phonon induced transitions much stronger than the photon induced ones. Consequently, $I_{light} - I_{dark} \ll I_{dark}$ and the SNR is only slightly larger than unity.

However, if the electron's initial state (level $E_1$) is a trap state where the electron is trapped and has a very localized wavefunction $\psi_1(r)$, as shown in FIG. 2, then the quantity $e_v \cdot \nabla \psi_1(r)$, which is the spatial derivative of $\psi_1(r)$ in the direction of light polarization, becomes very large. This happens regardless of the direction of light polarization, since the wavefunction is localized in all directions in three-dimensional space and is peaked at the trap site. Note also that $e^{ik\cdot r} \approx 1$ since the spatial extent of the electron's wavefunction in the trap site is much smaller than the wavelength of IR light. On the other hand, the final state wavefunction $\psi_2(r)$ in the conduction band, where the electron is free, is delocalized and spread out in space (see FIG. 2). Hence, clearly if electrons are excited from trap states into the conduction band, as opposed to excitation from the valence band to the conduction band, then the integral in the photon coupling term in Equation (4) becomes relatively large because of the large spatial gradient of the initial state wavefunction, but the integral in the phonon coupling term in Equation (5) remains small because the spatial overlap between the spread-out final state wavefunction and the peaked initial state wavefunction is small. That could make $M_{elec\text{-}photon}$ at least comparable to $M_{elec\text{-}phonon}$, even when $N_{phonon} \gg N_{photon}$. This will make $I_{light}$ and $I_{dark}$ perceptibly different at room temperature and provide an adequate SNR. Thus, "wavefunction engineering," whereby the initial wavefunction is localized in space and the final wavefunction is delocalized, may result in acceptable SNR at room temperature.

In order to exploit wavefunction engineering, an IR detector is made out of a wide bandgap semiconductor whose bandgap energy is much larger than the energy of IR photons. Thus, neither photons not phonons can excite electrons directly from the valence band to the conduction band and cause current by generating electron-hole pairs. However, if the semiconductor is fashioned into a nanowire embedded in an insulating matrix, then the interface defects cause shallow trap states to form close to the conduction band in energy. The energy difference between the conduction band and the trap states is less than the energy of IR photons and phonons, so that both can excite electrons from the trap states into the conduction band. The electron in traps states cannot produce current since they are not free to move, but electrons excited into the conduction band can since they become free. Since the wavefunction in the traps state is localized but the wavefunction in the conduction band is delocalized, the matrix element for electron photon coupling becomes comparable to that of electron phonon coupling despite the fact that the phonons vastly outnumber the photons. Therefore, about equal numbers of electrons are excited from trap states into the conduction band by photons and phonons at room temperature when there are many more phonons around than photons. The current produced by the photons and that produced by the phonons are very comparable despite the preponderance of phonons. This makes the ratio of the light to dark current (or the signal to noise ratio) significantly exceed unity even at room temperature and enables room temperature IR detection.

SUMMARY OF THE INVENTION

Embodiments of the present invention relate generally to semiconductor nanowires and photodetectors comprising them. Three basic figures of merit for a photodetector include: (1) Detectivity—a measure of how sensitive the detector is to light, usually determined by the minimum light intensity that the detector can detect in the presence of noise; (2) Signal-to-noise ratio—the ratio of the current under illumination to the current in the dark, where the larger this quantity is, the easier it is to detect the presence of light; and (3) Standby power dissipation—the current that flows through the detector in the dark causes power dissipation and drains the battery, thus, reducing the dark current so that the standby power dissipation is reduced is a plus.

Embodiments of the invention provide IR photodetectors that can operate at room temperature (without cooling) with high signal-to-noise ratio (i.e. large ratio of light current to dark current). This is made possible by the use of wavefunction engineering, whereby electrons from shallow trap states with localized wavefunctions are excited by IR photons (and phonons) to the conduction band with delocalized wavefunction. To implement such a "wavefunction-engineered" detector, two modifications are made. First, a semiconductor with large bandgap is used so that neither IR photons, nor phonons, can directly excite electrons from the valence to the conduction band (because Equation (1) cannot be satisfied). Second, electron traps states are introduced slightly below the conduction band level by embedding the nanowires in an insulating matrix. The material mismatch at the interface of the semiconductor nanowire and the insulator causes these trap states. The energy separation between the conduction band and the trap states is less than the energy of IR photons and phonons, so that in accordance with Equation (1), both photons and phonons should be able to excite electrons from the trap states (where electrons are trapped and cannot carry current) to the conduction band (where electrons are free and can carry current). The difference with conventional photodetectors is that instead of exciting electrons from the valence to the conduction band, here one is exciting electrons from trap states to the conduction band. FIG. 3 is a schematic drawing illustrating the energy band alignment of semiconductor and insulator showing the relative energy position of the trap levels.

Embodiments of the invention provide photodetectors with frequency selectivity. To accomplish this, the photodetectors comprise nanowires instead of bulk semiconductor material. The absorption of photons in a semiconductor is directly proportional to a quantity called the "joint electron-hole density of states," which is the number of allowed electron and hole states per unit energy per unit volume. In a nanowire, this quantity is non-zero only within a narrow window of frequencies whereby only photons that have energies within that window are absorbed and detected. This enables frequency selective detection.

A third modification that can further increase the signal to noise ratio is to exploit photomodulated electron tunneling. Here, the nanowires are modified to integrate a thin insulator layer at one end, as shown in FIG. 4. Photocurrent flowing through the nanowire now has to quantum-mechanically tunnel through the insulator. This current depends on the tunneling probability which is extremely sensitive to the tunneling barrier height which is the potential difference at the interface (difference between the conduction band energies of the semiconductor and the insulator). Absorption of photons and subsequent excitation of electrons from trap states into the conduction band of the semiconductor decreases the tunnel barrier height and increases the current significantly since the current is exponentially sensitive to the tunnel barrier height. This makes the current particularly sensitive to light and increases the signal-to-noise ratio further.

The tunneling current depends on the quantum mechanical tunneling (or transmission) probability through the insulator or tunnel barrier. The tunneling current through an arbitrary potential barrier was derived by Leo Esaki and Raphael Tsu as:

$$I_{tunnel} = \frac{2e}{h} \int_0^\infty dE |T(E)| [f(E - E_{F1}) - f(E - E_{F2})], \quad \text{EQ. (8)}$$

where e is the electronic charge, h is Planck's constant, E is the tunneling electron's kinetic energy, $E_{F1}$ is the Fermi energy at one side of the potential barrier and $E_{F2}$ is the Fermi energy at the other side, and $|T(E)|$ is the transmission (or tunneling) probability of an electron with energy E to tunnel through the barrier.

The function $f(E-E_F)$ is the Fermi-Dirac occupation probability, which is the probability of finding an electron having kinetic energy E. It is given by:

$$f(E - E_F) = \frac{1}{e^{\frac{E - E_F}{k_B T}} - 1} \quad \text{EQ. (9)}$$

where $k_B$ is the Boltzmann constant, T is the absolute temperature and $E_F$ is the Fermi energy, which is the energy where the occupation probability is 50%.

If the potential difference across the barrier is V, then:

$$E_{F1} - E_{F2} = eV \text{(forward bias)}$$

$$E_{F1} - E_{F2} = -eV \text{(reverse bias)} \quad \text{EQ. (10)}$$

For illustration and as shown in FIG. 5, an electron energy band diagram around the tunnel barrier is illustrated for the structure shown in FIG. 3. In FIG. 5, E is the electric field within the tunnel barrier and it is assumed to be constant in space because an ideal barrier should not have any fixed electric charge inside it. The voltage applied across the barrier to induce current flow under illumination is V. The barrier height is Φ. The insulator in this case is "alumina" (aluminum oxide).

Substituting Equation (10) in (8), the current versus voltage relation of tunneling current is represented as:

$$I_{tunnel} = \frac{2e}{h} \int_0^\infty dE |T(E)| [f(E - E_{F1}) - f(E + eV - E_F)]. \quad \text{EQ. (11)}$$

Equation (11) shows that the tunneling current depends on the transmission probability $|T(E)|$.

According to the Wentzel-Kramers-Brillouin (WKB) approximation, the tunneling probability is given by:

$$|T(E)| = \exp\left[-\int_{x_1}^{x_2} k(x)\,dx\right]. \qquad \text{EQ. (12)}$$

where k(x) is the electron's wavevector as a function of location x within the barrier. It is related to the electron's kinetic energy K.E. as:

$$k(x) = \frac{\sqrt{2m^*(K.E.)}}{\hbar} = \frac{\sqrt{2m^*(E - E_b(x))}}{\hbar}. \qquad \text{EQ. (13)}$$

where m* is the electron's effective mass within the barrier, E is the electron's total energy (kinetic+potential), $E_b(x)$ is the potential energy of the barrier as a function of distance, and $\hbar = h/2\pi$. Within the barrier itself, $E_b(x) = \Phi = -eEx$, where E is the electric field in the barrier. If there are no fixed charges within the barrier, then the electric field within the barrier is independent of x, according to the Poisson equation, $$\frac{dE}{dx} = \frac{\rho}{\varepsilon},$$

where ρ is the charge density, ∈ is the dielectric constant, and when ρ=0 (i.e., no charges present) then E is independent of x.

The integral $$\int_{x_1}^{x_2} k(x)\,dx$$

is then given by:

$$\int_{x_1}^{x_2} k(x)\,dx = \int_{x_2}^{x_2} \frac{\sqrt{2m^*(\Phi - eEx)}}{\hbar}\,dx = \qquad \text{EQ. (14)}$$

$$\frac{2}{3}\frac{\sqrt{2m^*}}{\hbar}\frac{1}{eE}\left[(\Phi)^{\frac{3}{2}}\left\{1-\left(1-\frac{eEW}{\Phi}\right)^{3/2}\right\}\right],$$

where $W = x_2 - x_1$.

Expanding the factor $$\left(1 - \frac{eEW}{\Phi}\right)^{3/2}$$

in a binomial series and retaining up to second order terms since $$\frac{eEW}{\Phi} \ll 1,$$

the result is:

$$\int_{x_1}^{x_2} k(x)\,dx = \frac{\sqrt{2m^*}}{\hbar}\left[\sqrt{\Phi}\,W - \frac{1}{4}\frac{eEW^2}{\sqrt{\Phi}}\right] \qquad \text{EQ. (15)}$$

Substituting this result in Equation (12), the result is:

$$|T(E)| = \exp\left[-\frac{\sqrt{2m^*\Phi}}{\hbar}W\left\{1 - \frac{1}{4}\frac{eEW}{\Phi}\right\}\right] \qquad \text{EQ. (16)}$$

Note that at 1 volt bias across the tunnel barrier, eEW≈1 eV, whereas Φ≈3 eV if the semiconductor is CdS and the insulator is alumina. Therefore the second term within the curly brackets is at least one order of magnitude smaller than the first term.

It is clear that if one can modulate the tunnel barrier height with light, then the current can increase dramatically under illumination since the current and transmission probability are exponentially sensitive to the barrier height Φ. This is possible since light will excite electrons from the trap levels at the semiconductor-insulator interface into the conduction band of the semiconductor. Once again, phonons do not excite electrons from trap levels into the conduction band of the semiconductor and therefore do not modulate the tunnel barrier height.

If electrons are excited into the conduction band by light, then the electron concentration in the conduction band increases. This "bends down" the conduction band since the electron concentration n(x) [number of electrons per unit length] in the conduction band of a semiconductor nanowire, at any position x, is given by:

$$n(x) = \frac{2k_F(x)}{\pi} \approx \frac{2\sqrt{2m^*(E_P - E_c(x))}}{\pi}, \qquad \text{EQ. (17)}$$

where $k_F(x)$ is the Fermi wavevector as a function of position x within the barrier, $E_F$ is the Fermi level, which is constant at equilibrium, and $E_c(x)$ is the conduction band edge energy in the barrier as a function of position. Note that $$\frac{\hbar^2 k_F^2(x)}{2m^*} = E_P - E_c(x).$$

Clearly if n(x) increases, then $E_F - E_c(x)$ increases, which means that the conduction band "bends down" in the energy band diagram with respect to the Fermi level. However, if the conduction band in the semiconductor bends down, then that decreases the tunnel barrier height Φ. From Equation (16), this will increase the tunneling probability exponentially and hence the tunneling current exponentially with increasing n(x). This is the basis of "photomodulated electron tunneling". Because of the exponential dependence, instead of the current increasing linearly with the number of electrons excited into the conduction band by light, it will now increase exponentially with that number. This will further increase the signal-to-noise ratio $I_{light}/I_{dark}$.

In accordance with embodiments of the invention, a photodetector was indeed built on this principle of wavefunction engineering and tested at room temperature. The signal-to-noise ratio of this photodetector was measured to be 2:1 at room temperature, which is adequate but not impressive. What is extremely impressive however is that the detectivity of this detector averaged over all detected IR wavelengths exceeded $10^7$ Jones at room temperature. This is among the highest room temperature detectivity reported for IR detectors In order to increase the signal-to-noise ratio further, a tunneling photodetector incorporating photomodulated electron tunneling was built. It exhibited a signal to noise ratio of 7:1 at 1.5 V bias, but more importantly reduced the standby power dissipation 7,500 times to only 0.12 microwatts, making it exceptionally energy-efficient.

The current invention addresses disadvantages of the prior art and overcomes a major shortcoming of room-temperature IR detectors, namely poor signal-to-noise ratio and poor detectivity. Room temperature detectors should have high detectivity (or sensitivity) to detect the faintest intensity of light. Additionally, it is desired that such detectors have a high light-to-dark contrast ratio for distinguishing and for reliability.

The inventors have discovered that the light-to-dark contrast ratio is increased by incorporating photomodulated electron tunneling. It also reduces standby power dissipation drastically. Specific objects of embodiments of the invention include IR and UV photodetectors comprising: (a) a conductive substrate, such as an aluminum substrate, with an upper surface; (b) a layer of insulator disposed on the upper surface of the aluminum substrate and comprising an array of columnar pores; (c) a plurality of semiconductor nanowires disposed within one or more of the pores and standing vertically relative to the upper surface of the aluminum substrate; (d) a layer of nickel disposed in operable communication with one or more of the semiconductor nanowires; and (e) wire leads in operable communication with the aluminum substrate and the layer of nickel for connection with an electrical circuit.

In embodiments, the photodetector can comprise: an array of semiconductor nanowires either standing vertically on a conducting substrate and capped by a conductor transparent to light, or lying horizontally on a non-conducting substrate and capped by conductors at both ends; and wire leads attached to the conductors and conducting substrate for connection to an electrical circuit. Non-conducting substrates can include quartz and similar materials. The semiconductor nanowires can comprise any direct bandgap semiconductor of bandgap energy between 0.3 eV and 4 eV or direct bandgap insulator of bandgap between 4 and 10 eV. Lithium fluoride (LiF) and magnesium oxide (MgO) are examples of direct bandgap insulators that can be used as nonowires. Preferred bandgap insulators can include semiconductors with a bandgap energy ranging for example from 4-10 eV, such as from 4 to 4.5 eV, or 5-5.5 eV, or 6-6.5 eV, or from 7-7.5 eV, or from 8-8.5 eV, or from 9-9.5, eV, or 10 eV. It is not critical how the nanowires are fabricated and methods can include self-assembly, or nanolithography, or combinations thereof.

Preferred embodiments include a photodetector comprising: a conductive substrate with an upper surface; a layer of insulator disposed on the upper surface of the conductive substrate and comprising an array of columnar pores; a plurality of semiconductor nanowires disposed within one or more of the pores and standing vertically relative to and with one end of the semiconductor nanowires in operable communication with the upper surface of the conductive substrate; a layer of conductive material disposed in operable communication with an opposing end of one or more of the semiconductor nanowires; and wire leads in operable communication with the conductive substrate and the layer of conductive material for connection with an electrical circuit. In preferred embodiments, the conductive substrate is aluminum and the conductive material is nickel.

Such photodetectors can be configured such that the semiconductor nanowires have a diameter greater than 0 and up to 100 nm. Preferred embodiments comprise nanowires with a diameter in the range of 5-50 nm. Especially preferred are photodetectors with semiconductor nanowires having a diameter of about 10 nm.

Photodetector embodiments can comprise semiconductor nanowires of at least one of CdS, CdSe, CdTe, GaAs, ZnS, ZnSe, or ZnTe, or one or more alloy thereof. Indeed, the semiconductor nanowires can comprise any binary or ternary group II-VI or III-V semiconductor compound, or alloy.

The insulator preferably comprises a layer of porous alumina (aluminum oxide). The alumina layer can be about 1-10 µm thick, but preferred embodiments comprise an alumina or insulator layer with a thickness of about 1 µm. In embodiments, the barrier layer of insulator is disposed between the columnar pores and the upper surface of the conductive substrate.

Photodetector embodiments can comprise an insulator or alumina layer with columnar pores extending lengthwise therethrough. In embodiments, the columnar pores pass completely through the layer of alumina. In other embodiments, the pores have a bottom and do not pass completely through the alumina such that there is a barrier layer of alumina disposed between the bottom of the columnar pores and the upper surface of the aluminum substrate. Preferably, when there is a barrier layer of alumina, the barrier layer has a thickness ranging from above 0 to 20 nm, and more preferably from about 1-5 nm. In preferred embodiments, some of the columnar pores are through holes through the alumina or insulator layer, while some of the pores have a bottom.

The photodetectors can be configured to be capable of detecting IR, UV, or visible light. In preferred embodiments, the photodetectors are configured to selectively detect only IR or UV light and only certain wavelengths of IR or UV light.

In embodiments, the wire leads are gold wire, but can be any conductive material.

The semiconductor nanowires can have a bandgap ranging between 1-4 eV.

The photodetectors can be capable of a signal-to-noise ratio of from 2 to 10, such as about 3, 4, 5, 6, 7, 8, or 9. Additionally or alternatively, the photodetectors can be capable of a detectivity at room temperature ranging from $1 \times 10^5$ Jones to $1 \times 10^8$ Jones.

In embodiments, when exposed to IR or UV light, electrons in the semiconductor nanowires of the photodetectors are excited from trap states to the conduction band.

The photodetector can have a layer of nickel that is up to 50 nm thick, such as from about 5-45 nm thick, or about 10-30 nm thick, or even about 20-25 nm thick. In preferred embodiments, the layer of conductive material (such as nickel) is 50 nm thick. The top contact does not have to be nickel and can be any transparent conductor. Indium tin oxide can also be used as the conductor or conductive material.

Semiconductor material can be disposed between the insulator layer and the layer of nickel. In embodiments, this is achieved by overfilling the pores with semiconductor material. This layer of additional semiconductor material is thus in operable communication with the semiconductor nanowires within the pores and the layer of nickel. Again, when referring to the layer of nickel, this can be any conductor material.

The photodetectors and nanowires can be made by any applicable process known in the art. Provided in this specification are representative methods that can also be used. Any one or more of the method steps can be omitted to fit a desired application or result. Likewise, any one or more of the method steps can be performed in any order, if applicable. Other method steps can also be added. One such method for making nanowires comprises: (a) providing 99% purity or greater aluminum foil with a thickness between 0-1 mm; (b) degreasing and electropolishing the aluminum foil in a solution of perchloric acid, butyl cellusolve, ethanol and distilled water to reduce surface roughness; (c) optionally rinsing the aluminum foil in distilled water; (d) anodizing the aluminum foil using sulfuric acid or oxalic acid to create an alumina film with columnar pores on a surface of the aluminum foil; (e) stripping off the alumina film using hot chromic/phosphoric acid; (f) repeating the anodizing and stripping until an alumina film with a desired thickness and pore diameter is obtained; (g) removing or reducing thickness of any alumina barrier present between the aluminum foil and the pores by reverse polarity etching using phosphoric acid at room temperature; and (h) depositing semiconductor material into at least some of the columnar pores to obtain an array of semiconductor nanowires vertically disposed with respect to the aluminum foil.

A preferred method includes depositing the semiconductor material using dc electrodeposition and overfilling at least some of the pores such that semiconductor material is disposed on top of the alumina film.

Methods of making a photodetector according to embodiments of the invention can comprise: (a) providing 99% purity or greater aluminum foil with a thickness between 0-1 mm; (b) degreasing and electropolishing the aluminum foil in perchloric acid, butyl cellusolve, ethanol and distilled water to reduce surface roughness and obtain an aluminum substrate; (c) optionally rinsing the aluminum foil in distilled water; (d) anodizing the aluminum foil using sulfuric acid or oxalic acid to create an alumina film with columnar pores on a surface of the aluminum foil; (e) stripping off the alumina film using hot chromic/phosphoric acid; (f) repeating the anodizing and stripping until an alumina film with a desired thickness and pore diameter is obtained; (g) removing or reducing thickness of any alumina barrier present between the aluminum foil and the pores by reverse polarity etching using phosphoric acid at room temperature; (h) depositing semiconductor material into at least some of the columnar pores to obtain an array of semiconductor nanowires vertically disposed with respect to the aluminum foil; (i) depositing a layer of nickel on top of the alumina film; and (j) attaching wire leads to the layer of nickel and the aluminum substrate.

A more general method of making a photodetector can comprise: providing a conductive substrate with 99% purity or greater with a thickness between 0-1 mm; degreasing and electropolishing the conductive substrate to reduce surface roughness; optionally rinsing the conductive substrate in distilled water; anodizing the conductive substrate to create an insulative film, which comprises an oxide of the conductive substrate, with columnar pores on a surface of the conductive substrate; stripping off the film; repeating the anodizing and stripping until a film with a desired thickness and pore diameter is obtained; removing or reducing thickness of any oxide barrier present between the conductive substrate and the pores; depositing semiconductor material into at least some of the columnar pores to obtain an array of semiconductor nanowires vertically disposed with respect to the conductive substrate; depositing a layer of conductive material on top of the insulative film; and attaching wire leads to the layer of conductive material and the conductive substrate.

Methods also include a method of making nanowires comprising: providing a conductive substrate with 99% purity or greater and with a thickness between 0-1 mm; degreasing and electropolishing conductive substrate to reduce surface roughness; optionally rinsing the conductive substrate in distilled water; anodizing the conductive substrate to create an insulative film, which comprises an oxide of the conductive substrate, with columnar pores on a surface of the conductive substrate; stripping off the insulative film; repeating the anodizing and stripping until an insulative film with a desired thickness and pore diameter is obtained; removing or reducing thickness of any oxide barrier present between the conductive substrate and the pores; and depositing semiconductor material into at least some of the columnar pores to obtain an array of semiconductor nanowires vertically disposed with respect to the conductive substrate.

Detectors provided by embodiments of the invention can detect the entire electromagnetic spectrum from infrared (IR) to ultraviolet (UV) at room temperature. This is made possible by quantum mechanical wavefunction engineering, which selectively suppresses phonon-mediated excitation of electrons into the conduction band, while allowing photon-mediated excitation. This increases the room-temperature signal-to-noise ratio (SNR) which is the ratio of current under illumination to the current in the dark. This ratio is further enhanced by integrating the detector with a tunnel barrier where light modulates the barrier height and hence the tunneling current.

An additional feature of the inventive nanowire IR photodetectors is an SNR of approximately 2 and a detectivity exceeding $10^7$ cm-($\sqrt{Hz}$)/watt at room temperature. This detectivity is ten times better than that reported in the state-of-the-art as described by Jayaweera, et al., Applied Physics Letters, 93, 021105 (2008). Furthermore, because this detector is fabricated with electrochemical self assembly in a beaker, it is much cheaper than other photodetectors and is robust, reliable and mass-producible as well due to the high throughput capability of its production process.

Additional desired features of such detectors are that they have low standby power dissipation for energy efficiency. The tunnel detector of embodiments of the present invention has very low dark current and hence very low standby dissipation. Further, the capacitive detector is non-leaky and ideally does not dissipate any energy.

Yet another object of embodiments of the present invention is that the detectors are light frequency selective, i.e. preferentially detect light within a band of frequencies thereby enabling frequency-resolved detection. Such a feature is not possible with bulk semiconductor photodetectors. The inventors have made this possible by one-dimensional density of states in 10 nm diameter nanowires. Specific embodiments of the invention provide detectors capable of detecting both IR and UV light, as well as detectors capable of selectively detecting only IR light or selectively detecting only UV light.

The nanowire material of detectors of the invention is a semiconductor with a large bandgap far exceeding IR photon or phonon energies, which disallows excitation of electrons from the valence to the conduction band by either photons or phonons. By embedding the nanowires in an insulating matrix (alumina), one can introduce trap states in the semiconductor's bandgap which form as a result of the material mismatch between the semiconductor and the insulator. These trap states have been characterized in the past and were found to be filled with electrons at room temperature. Capacitance-voltage measurements had shown that the nanowires are n-type, which means that the Fermi level must be much closer to the conduction band than the valence band at equilibrium and all but the shallowest traps will be filled with electrons.

Under illumination, the shallow traps are continuously emptied by light as electrons are excited out of them into the conduction band. Once in the conduction band, these electrons flow out into the contact and contribute to the photocurrent. However, the emptied traps are quickly refilled by thermal (multiple phonon-mediated) transitions from the valence band as shown in FIG. 3. This leaves behind holes in the valence band that also flow out into the contact and contribute to photocurrent. In steady state, the emptying rate of the traps due to photons and the refilling rate due to phonons should balance and a continuous flow of photocurrent will result.

Additional information about the nanowires and photodetectors included within the invention may be found literature authored by the inventors. See Saumil Bandyopadhyay, Jennette N. Mateo, Supriyo Bandyopadhyay, and Garry Glaspell, "Signature of quasi one-dimensionality in the absorption spectra of electrochemically self-assembled nanowires," *Physica E*, 43, 1255-1261 (2011) and see Saumil Bandyopadhyay, Pratik Agnihotri and Supriyo Bandyopadhyay, "A self assembled room temperature nanowire infrared photodetector based on quantum-mechanical wavefunction engineering," *Physica E*, 44, 1478 (2012).

BRIEF DESCRIPTION OF THE DRAWINGS

The accompanying drawings illustrate certain aspects of some embodiments of the present invention, and should not be used to limit or define the invention. Together with the written description the drawings serve to explain certain principles of the invention.

FIGS. 13A-H are schematic diagrams illustrating representative fabrication steps to prepare samples for absorption studies: (A) starting aluminum foil; (B) anodization of aluminum to produce a porous alumina film on the surface; (C) reverse polarity etching to remove the barrier layer; (D) dc electrodeposition to fill the pores with semiconductors; (E) application of varnish on surface prior to removing aluminum; (F) removal of aluminum in $HgCl_2$; (G) removal of varnish in ethanol; (H) capture of sample on a quartz slide.

FIGS. 20A-B are graphs illustrating photoluminescence spectra of nanowires taken with an He—Ne laser.

FIGS. 21A-B are schematic diagrams illustrating the energy band diagrams in the direction of current flow: (A) forward bias; (B) reverse bias, where the conduction band profiles in the dark are shown in blue and under illumination are shown in red.

DETAILED DESCRIPTION OF VARIOUS EMBODIMENTS OF THE INVENTION

Reference will now be made in detail to various exemplary embodiments of the invention. It is to be understood that the following discussion of exemplary embodiments is not intended as a limitation on the invention. Rather, the following discussion is provided to give the reader a more detailed understanding of certain aspects and features of the invention.

Nanowire IR detectors according to embodiments of the invention can be electrochemically self assembled using a porous alumina template technique. In a representative fabrication method, the starting material is commercially available aluminum foil, such as 99.999% pure aluminum foil, with a thickness in the range of about 0.1 to 1 mm thick. A preferred thicknesses for example can be about 100 µm, 200 µm, 300 µm thick and so on.

In embodiments, the aluminum foil is preferably chemically degreased and electropolished. A solution of perchloric acid, butyl cellusolve, ethanol and distilled water can be used for degreasing and electropolishing in a commercial Buehler Electromet electropolisher for about 30-60 s at 60 V dc to reduce the surface roughness to about 3 nm. See R. E. Ricker, A. E. Miller, D-F Yue, G. Banerjee and S. Bandyopadhyay, J. Elec. Mat., 25, 1585 (1996). A preferred degreasing and electropolishing solution can comprise 62 cc perchloric acid, 700 cc ethanol, 100 cc butyl cellusolve and 137 cc distilled water. The aluminum foil treated in this manner is characterized by a mirror-like surface. To prevent overheating of the solution, the electropolishing can be carried out in intervals of 5 s. This results in reducing the root-mean-square surface roughness of the foil to about 3 nm as verified by atomic force microscopy. See R. E. Ricker, et al., J. Electron. Mater. 25 (1996) 1585.

The foil is then rinsed in distilled water and anodized in a Perkin-Elmer flat cell using the aluminum as anode and a platinum mesh as cathode. The electrolyte is either 15% sulfuric acid or 0.3M oxalic acid (3% oxalic acid). The anodization is preferably performed for a time ranging from about a few minutes to about 15 minutes and at a voltage of about 5-60 V, such as about 15 V. The process of anodization creates a porous alumina film on the surface of the foil, which is stripped off in hot chromic/phosphoric acid (0.2M $H_2CiO_4$/ 0.4M $H_3PO_4$) and the anodization can be repeated for 1 h to produce a thicker porous film. This film too is stripped off and the final anodization is carried out for 15 min to produce a porous film on the foil.

Figure 6:
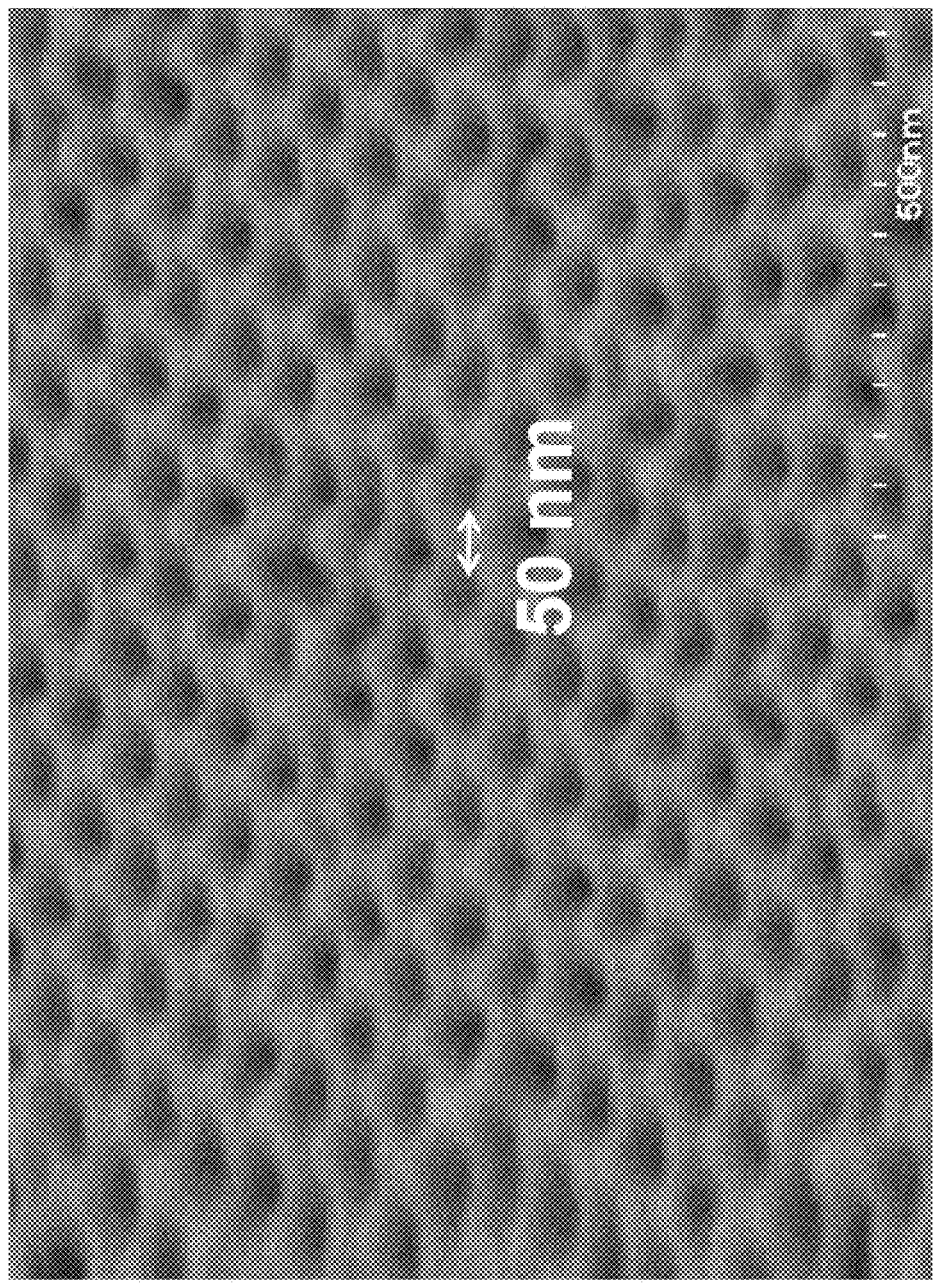
FIG. 6 is a scanning electron micrograph image of porous alumina film formed by anodization of aluminum in oxalic acid, where the pore size is about 50 nm in diameter.
Figure 7:
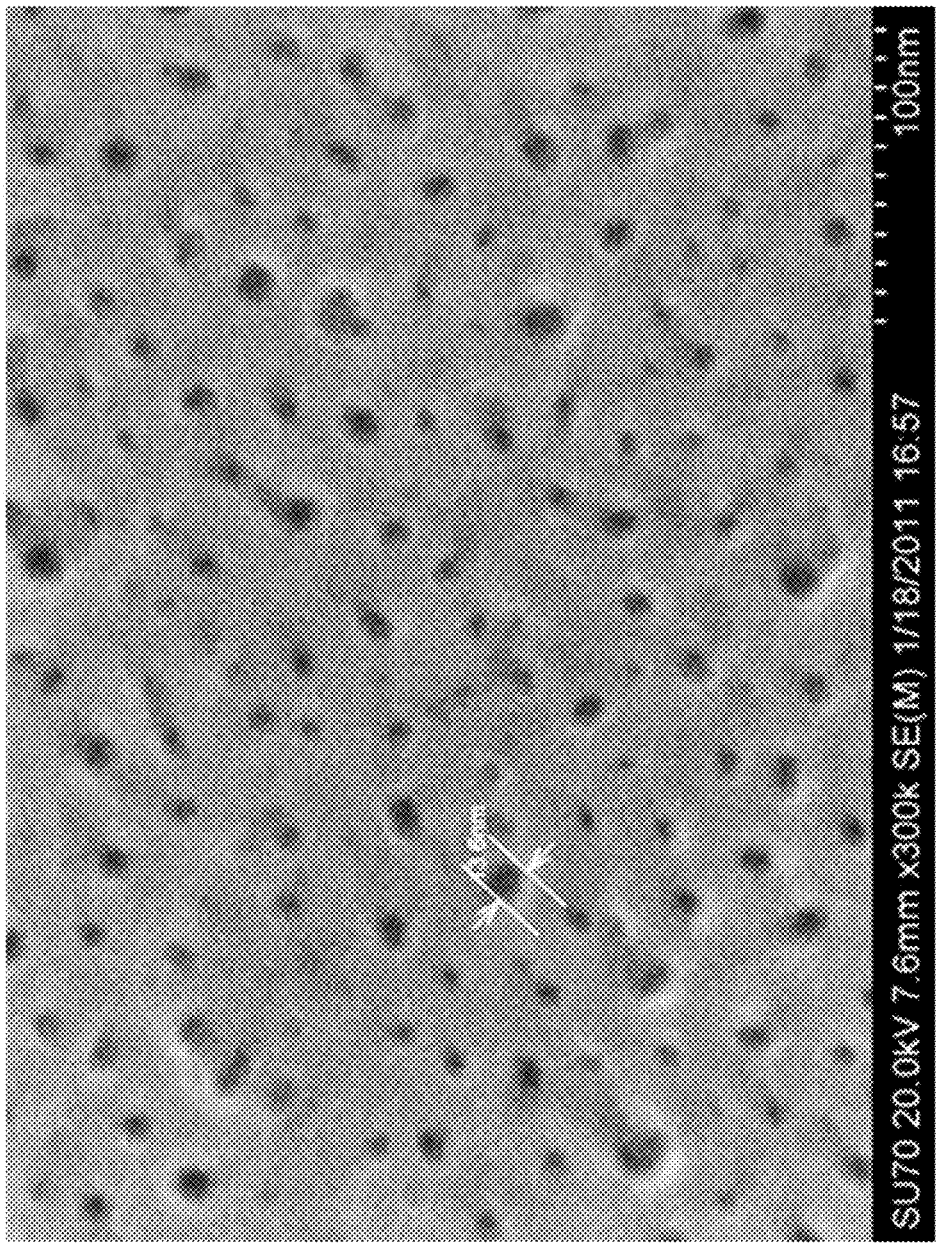
FIG. 7 is a field emission scanning electron micrograph image of a porous alumina film with a pore diameter of about 10 nm.

In embodiments, the porous film can be approximately 1 µm thick and preferably comprises a well ordered array of nanopores having a diameter of about 1-100 nm, such as from about 5-95 nm, or from about 10-15 nm, or from about 20-30 nm, or from about 25-35 nm, or from about 40-50 nm, or from about 45-55 nm, or from about 60-70 nm, such as from about 65-75 nm, or from about 80-90 nm, and so on. Preferably, the nanopores have a diameter in the range of about 10-50 nm, such as from about 5-60 nm, including 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 m, 40 nm, 41 nm, 42 nm, 43 nm, 44 nm, 45 nm, 46 nm, 47 nm, 48 nm 49 nm, 50 nm, 51 nm, 52 nm, 53 nm, 54 nm, 55 nm, 56 nm, 57 nm, 58 nm, 59 nm, or 60 nm. For some applications, even larger diameter nanowires may be desired, such as with a diameter ranging from 150-500 nm, including from about 200-400 nm, or from 250-35 nm, such as about 300 nm. A field emission scanning electron micrograph (SEM) image of a nanoporous film prepared using an electrolyte of oxalic acid with pores of about 50 nm in diameter is shown in FIG. 6. Further, a nanoporous film prepared using an electrolyte of sulfuric acid with pores of about 10 nm in diameter is shown in FIG. 7. If desired, repeated anodization can be used to improve the regimentation of the pores. See H. Masuda, M. Satoh, Jpn. J. Appl. Phys. Pt. 2 35 (1996) L126.

At the bottom of the pores, there is a thin barrier layer of alumina (typically about 20 nm thick) separating the bottom of the pores from the aluminum substrate. This is called a "barrier layer" in the literature since photocurrent will always flow along the length of the nanowires, and hence must tunnel through this barrier. Before carrying out dc electrodeposition to selectively deposit the semiconductor within the nanopores, the thin alumina barrier layer that forms at the bottom of the pores can be removed by a method known as "reverse polarity etching." For this purpose, the anodized foil is contacted with 0.05 M (5%) phosphoric acid at room temperature in a flat cell and a voltage of 7 V dc is applied between the foil and platinum mesh using the foil as the cathode. This can be performed for about 30 s to about 1 hr, such as from about 45 s to about 45 minutes, to remove the barrier layer, or at least reduce its width, which barrier layer would have blocked dc current flow along the pore's length and prevented de electrodeposition. The final barrier width typically varies between 2 and 20 nm. Alternatively, the barrier layer can be removed by soaking the film in 5% phosphoric acid for up to about 60 minutes. This process is known to etch the barrier layer much faster than the pore walls, so that the increase in the diameter of the pores during the soaking process is negligible. There are many other methods of removing the barrier layer that can also be used, none of which is any better controlled. This method has been found to be the simplest.

Next, the pores are selectively filled with the semiconductor of interest by de electrodeposition using selected electrolytes. This process results in the formation of vertically standing semiconductor nanowires within the pores. The bottom ends are in contact with the underlying aluminum if the barrier layer had been removed in the preceding step, or in embodiments the barrier layer can be reduced in thickness. Semiconductors that can be deposited in this manner include binary and ternary II-VI and III-V compounds (including but not limited to one or more of cadmium sulfide (CdS), cadmium selenide (CdSe), cadmium telluride (CdTe), zinc oxide (ZnO), zinc sulfide (ZnS), zinc selenide (ZnSe), zinc telluride (ZnTe), gallium arsenide (GaAs), and alloys of such compounds including cadmium zinc telluride (CdZnTe), otherwise referred to as CZT). Indeed, any semiconductor compound can be used with preferable compounds having a bandgap in the range of about 1 to 4 eV at 25° C., such as a semiconductors with a bandgap of 1-2 eV, such as 1.1 eV, 1.2 eV, 1.3 eV, 1.4 eV, 1.49 eV, 1.5 eV, 1.6 eV, 1.7 eV, 1.73 eV, 1.8 eV, 1.9 eV; or semiconductors with a bandgap ranging from 2-3 eV, such as 2.1 eV, 2.2 eV, 2.25 eV, 2.3 eV, 2.4 eV, 2.42 eV, 2.5 eV, 2.6 eV, 2.7 eV, 2.8 eV, or 2.9 eV; or semiconductors with a bandgap ranging from 3-4 eV, such as 3.1 eV, 3.2 eV, 3.3 eV, 3.37 eV, 3.4 eV, 3.5 eV, 3.54 eV, 3.6 eV, 3.7 eV, 3.8 eV, 3.84 eV, 3.9 eV, or 3.91 eV.

In a first example, CdS is selectively electrodeposited within the pores from a solution of cadmium perchlorate, dimethyl sulfoxide (DMSO) and sulfur powder. The electrodeposition is carried out in a Perkin Elmer flat cell using an ac voltage of 12 V rms and 200 Hz frequency at a temperature of 100° C. During the negative ac cycle, the $Cd^{++}$ ions in the solution is reduced to zero-valent material and is selectively deposited within the pores because they offer the least impedance path for the ac current to flow. The Cd metal then reacts with sulfur in the solution at the high temperature and forms CdS nanowires within the pores. In embodiments, the nanowires can have a length corresponding to the thickness of the porous film, or can be less than the thickness of the film if the pores are underfilled or slightly more than the thickness of the film if the pores are overfilled during the fabrication process. The length of the nanowires can range between 0-10 μm. Preferably, the nanowires have a length ranging from about 1-5 μm, such as 2 μm, 3 μm, or 4 μm, or from about 6-9 μm. In especially preferred embodiments, the nanowires have a length of about 1 μm. Here, the CdS nanowires were fabricated to have a diameter of about 50 μm and a length of about 1 μm.

Figures 8A, 8B:
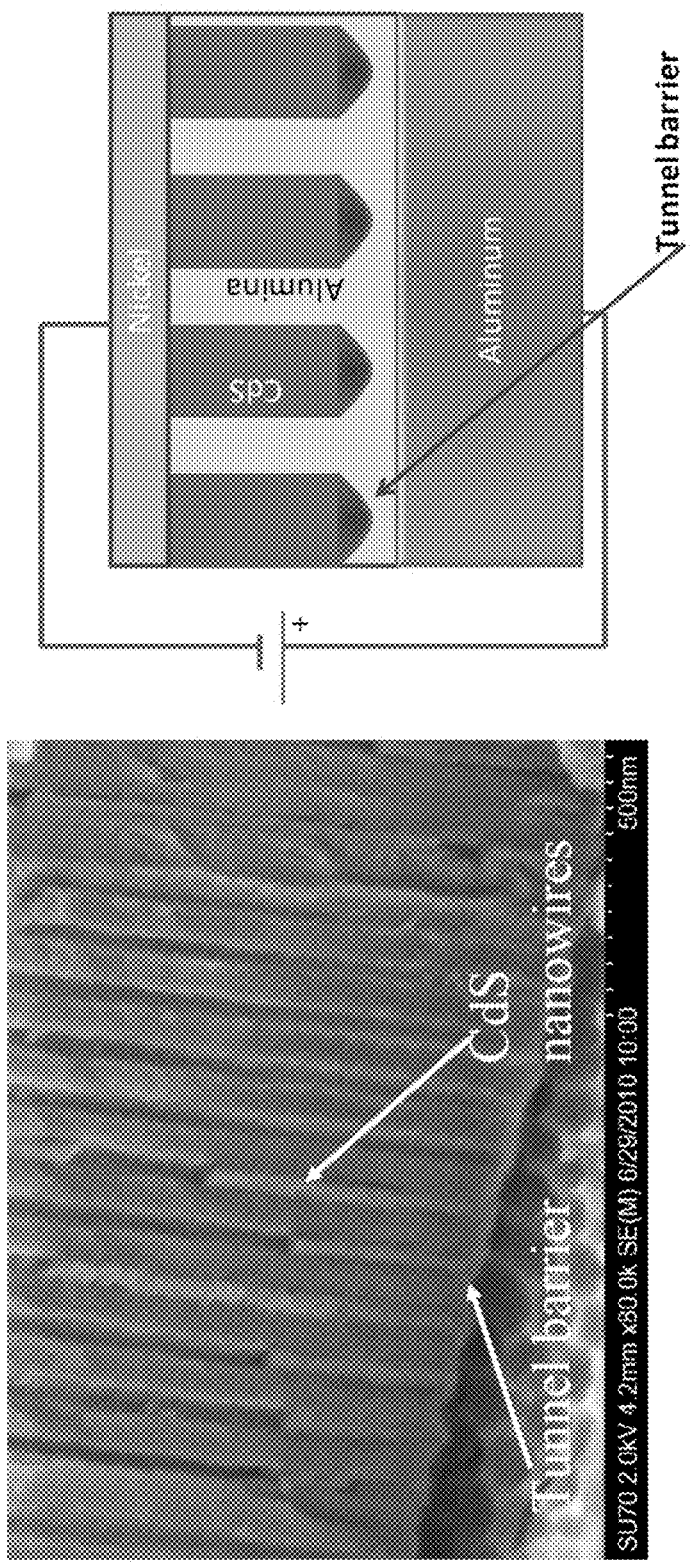
FIGS. 8A-B are a cross-section field emission scanning electron micrograph image showing the nanowires partially filling the pores, and a schematic illustration of the structure shown in FIG. 8A, respectively.

The diameter of the nanowires also corresponds to the diameter of the pores of the film. In embodiments, the nanowires can have a diameter of about 1-100 nm, such as from about 5-95 nm, or from about 10-15 nm, or from about 20-30 nm, or from about 25-35 nm, or from about 40-50 nm, or from about 45-55 nm, or from about 60-70 nm, such as from about 65-75 nm, or from about 80-90 nm, and so on. Preferably, the nanopores have a diameter in the range of about 2-50 nm, such as from about 1-5 nm, or from 2-10 nm, or from 3-4 nm, or 5-60 nm, including 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, 50 nm, 51 nm, 52 nm, 53 nm, 54 nm, 55 nm, 56 nm, 57 nm, 58 nm, 59 nm, or 60 nm. For some applications, even larger diameter nanowires may be desired, such as with a diameter ranging from 150-500 nm, including from about 200-400 nm, or from 250-35 nm, such as about 300 nm. In preferred embodiments, the nanowires have a length of about 1 μm and a diameter of about 10-50 nm. Especially preferred are nanowires having a length of about 1 μm and a diameter of about 5-10 nm FIG. 8A shows a cross-section SEM image of nanowires formed within the pores of the film, while FIG. 8B provides a schematic of the structure. Note that the tunnel barrier thickness in embodiment is non-uniform (some wires have a thick barrier, 20 nm, and others thin, about 2 nm). This has no effect on device performance since the wires form electrically parallel resistors. The wires with the thinnest barriers will have the least electrical resistance and provide the dominant current path. Preferably the tunnel barrier has a thickness between about 0-20 nm, such as 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, or 19 nm.

Figure 9A:
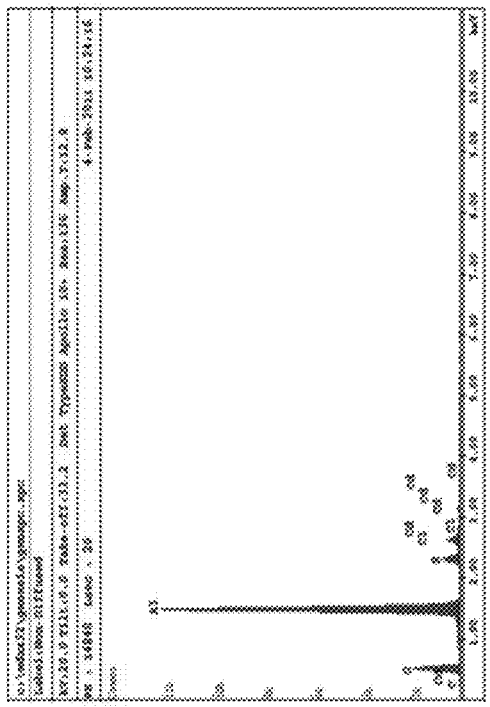
FIGS. 9A-B are a graph and data, respectively, illustrating energy dispersive analysis of X-ray (EDAX) data of CdS nanowire.
Figure 9B:
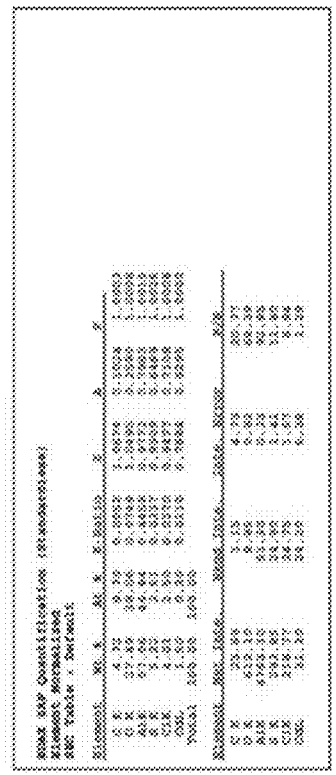

When CdS is electrodeposited in porous alumina films, numerous traps states form at the interface between CdS and alumina. These traps play the critical role in room temperature IR detection with large signal-to-noise ratio, as explained earlier. Energy dispersive analysis of x-ray (EDAX) was carried out to verify that the wires formed inside the pores comprise CdS. The results are shown in FIG. 9, where the Cd and S peaks attest to the presence of CdS within the pores.

Figure 10:
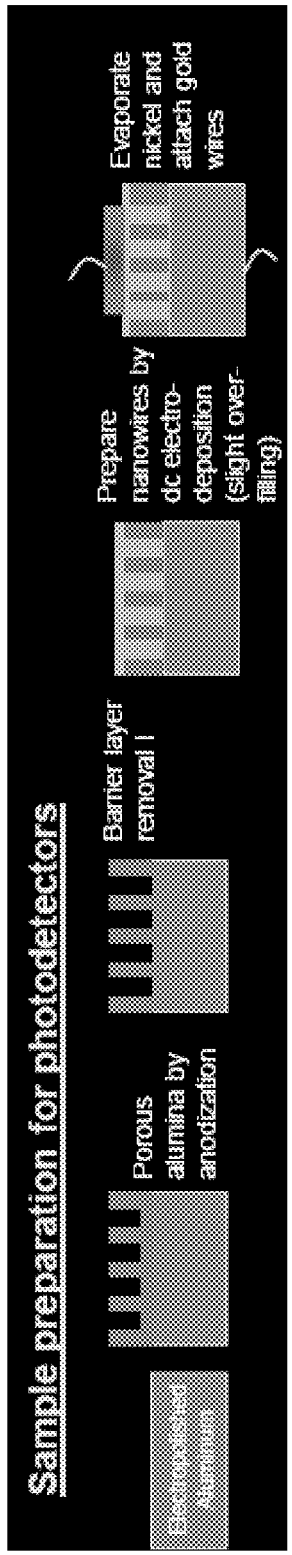
FIG. 10 is a schematic diagram illustrating representative process steps for fabrication of nanowire IR photodetectors.
Figure 11:
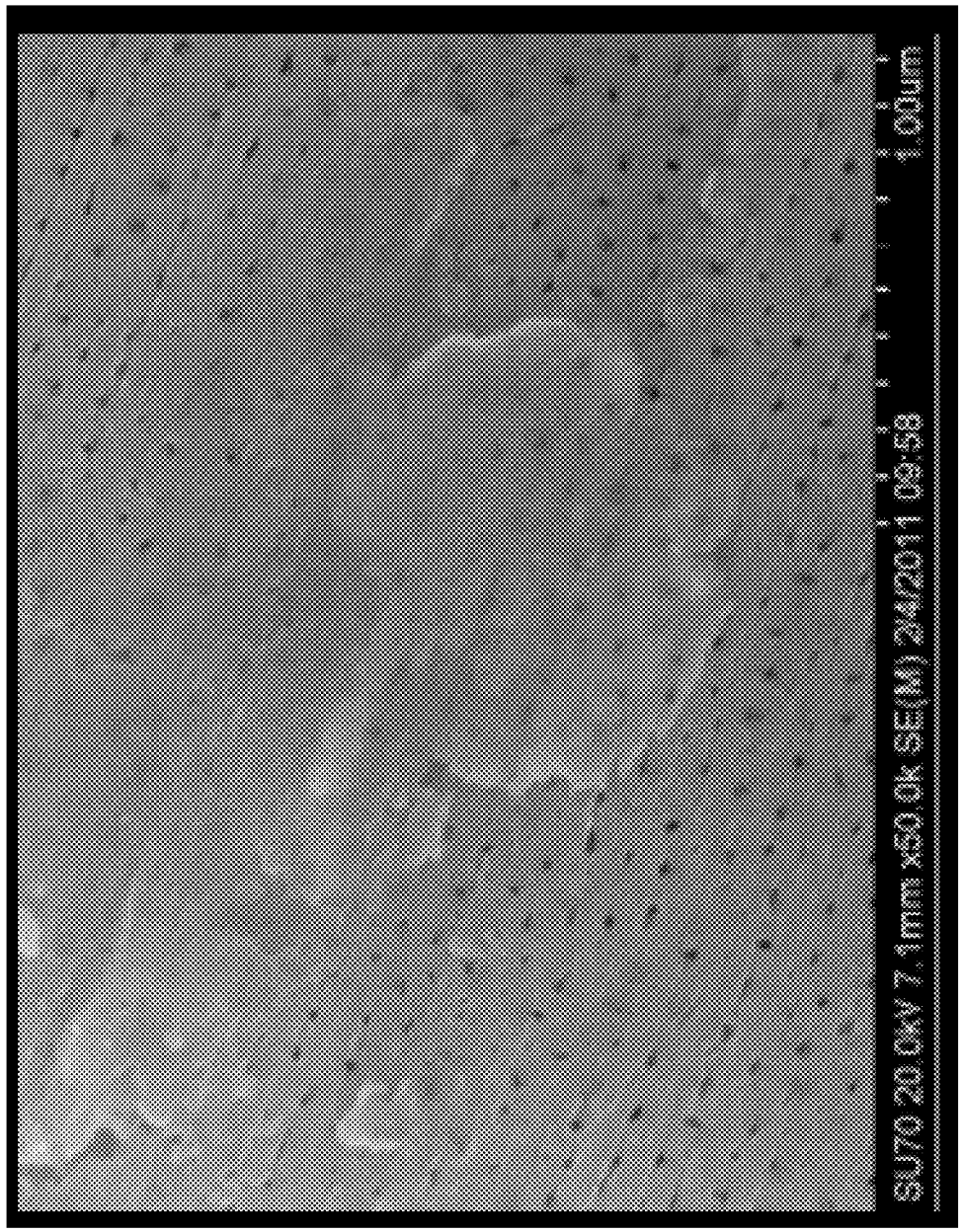
FIG. 11 is a scanning electron micrograph image showing pores overfilled with semiconductor.

Once the wires are formed within the pores, 50 nm of nickel or indium tin oxide (ITO) or any other conductor which is semi-transparent to IR is evaporated through a mask on the sample surface for contact formation using an electron beam evaporator. In embodiments, the pores are slightly overfilled during dc electrodeposition so that they not only get filled to the brim, but the semiconductor spills out into the surface forming a thin surface layer. A representative process for making photodetectors is illustrated in FIG. 10. Overfilling is controlled by monitoring the color change of the surface visually during electrodeposition. The deposition process is terminated as soon as the surface begins to change color. Extensive scanning electron microscopy has confirmed that this indeed correlates with slight overfilling. For example, a scanning electron micrograph is provided in FIG. 11, which shows that the pores have been overfilled with semiconductor to allow good electrical contact to the nanowires.

Since pore filling is non-uniform, it is expected that only certain regions of the samples will contain overfilled pores. The thickness of the spilled layer is difficult to measure, but since the underlying pores through this layer can been seen with a 2 keV electron beam, the layer cannot be more than a few tens of nm thick. An electrical contact is then delineated on the top surface of each sample by e-beam evaporating 50 nm of nickel through a mask. The contact area is large enough (0.5 cm×0.5 cm) to cover many regions that have the surface layer caused by overfilling. This ensures that several parallel nanowires are electrically connected at both ends by the nickel contact and the bottom aluminum contact, so that good electrical characteristics can be expected. Finally gold wires are attached to the top contact (e.g., the front of the nickel film) and the bottom contact (e.g., the back of the aluminum substrate) with silver paste to complete the photodetector fabrication. See FIG. 10.

In a second example, in order to electrodeposit CdSe selectively within the pores, the samples are rinsed thoroughly in distilled water and brought into contact with a solution of dimethylsulfoxide (DMSO) comprising 50 mM cadmium perchlorate, 10 mM lithium perchlorate (to increase conductivity of the solution) and 10 mM selenium powder, preheated to 200° C., in a flat cell. A dc voltage of 8 V is applied between the foil and the platinum mesh, using the former as the cathode. This drives the cation Cd++ selectively into the pores since the latter offer the least resistance path for the current to flow. Once inside the pores, the Cd++ ion is reduced to zero-valent Cd atoms by absorbing electrons and reacting with Se in the solution to form CdSe. In the end, a dense array of vertically standing CdSe nanowires of diameter 10 nm dispersed uniformly in alumina is produced. The areal density of this wire is about $5 \times 10^{11}$ g·cm². In order to fabricate ZnS nanowires, zinc perchlorate can be substituted for cadmium perchlorate and sulfur powder for selenium powder with the same process. Likewise, to prepare CdTe or ZnTe nanowires similar substitutions using cadmium perchlorate and tellurium powder or zinc perchlorate and tellurium powder can be used. If desired, the composition of one or more of the nanowires can be changed during the fabrication process by introducing a different composition after filling of the pores has begun. For example, a first composition of CdS can be grown within one or more of the pores, then a composition of CdTe could be grown on top of the CdS, then CdS can be grown on top of the CdTe layer.

Figures 12A, 12B:
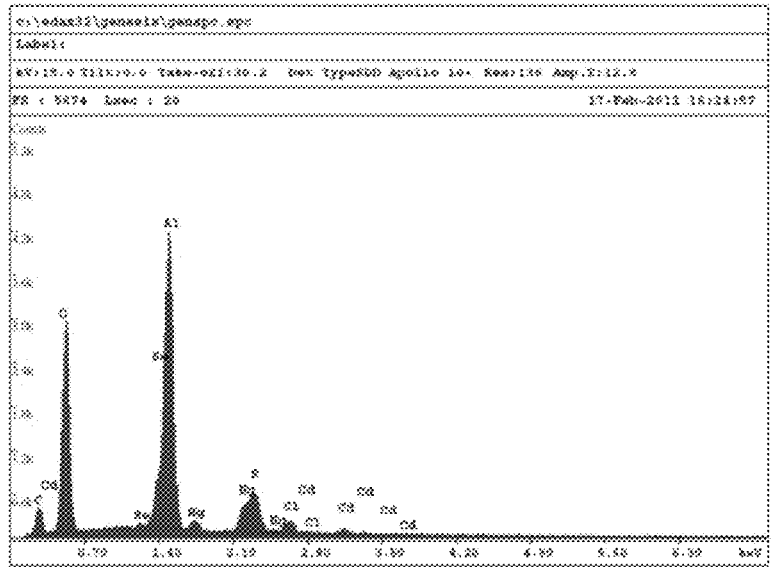
FIGS. 12A-B are a graph and data, respectively, illustrating energy dispersive X-ray analysis of CdSe nanowire.

Similar samples have been extensively characterized by the inventors in the past using cross-section scanning electron microscopy to verify pore filling. Here, energy dispersive x-ray analysis verified the composition of the material inside the pores. For example, FIG. 12 shows an energy dispersive analysis of X-ray (EDAX) data of CdSe nanowire samples produced by electrodepositing CdSe in the pores. The Al and oxygen peaks come from the alumina template, the Hg and Cl peaks come from $HgCl_2$ that was used to dissolve out the aluminum substrate to make semi-transparent samples, the S peak comes from sulfuric acid used in the anodization step, the C comes from the varnish and ethanol, and the Cd and Se peaks come from CdSe in the pores. This data clearly shows the presence of Cd and Se in the samples attesting to successful electrodeposition.

In order to test the photodetectors, i.e. to verify that a current response is produced when IR or UV light is incident on the detector, the current versus voltage characteristic of the photodetector can be measured in the dark under IR or UV illumination. A Hewlett-Packard semiconductor parameter analyzer can be used for this purpose. Alternatively, or in addition, infrared absorption can be measured with a Fourier Transform Infrared (FTIR) spectrometer. For testing UV absorption, an ultra-violet laser (such as an He—Ne laser or an Nd:YAG laser) and a monochromator with wavelength resolution of 1 nm can be used. The IR or UV absorption spectra of samples with unfilled pores (no electrodeposition) can be used for background subtraction in order to eliminate spurious absorption.

For testing IR absorption, the IR source can be a 250 Watt IR lamp radiating within π radians in the near- to mid-infrared. The bulb's surface can be placed 4 cm away from the sample for the measurements. If the bulb is brought closer to the sample, the incident light power will increase and the light current will increase, whereas if the bulb is retracted farther, the incident light power decreases and the light current decreases. If it is found that a single sample does not produce enough absorption, three samples can be stacked together. The absorption scans are preferably repeated up to about 64 times to achieve good signal-to-noise ratio. The samples can be mounted on a large metal chuck that immediately conducts away any heat generated by the IR lamp to eliminate spurious thermal effects and ensure that any change in the current when illuminated will be due to the IR light alone.

In embodiments, for measurement of the IR or UV absorption spectra of the nanowires, the samples should be disposed on a semi-transparent substrate by removing the metallic aluminum substrate from the bottom. This is accomplished by first applying a thick organic varnish on the surface of the sample and then soaking the film overnight in a solution of $HgCl_2$ which selectively etches away the aluminum substrate (which is opaque to IR and UV light). The purpose of the varnish is to provide mechanical stability to the approximately 1 μm thin film during this process. Finally, the sample is immersed in ethanol overnight to dissolve out the varnish. The released thin film floats to the surface of the ethanol solution since its density is less than that of ethanol. The floating film is then carefully captured on a quartz slide that is transparent to ultra-violet radiation. The film is nitrogen dried and ready for absorption measurement. Representative preparation steps are shown in FIGS. 13A-H.

Figure 14A:
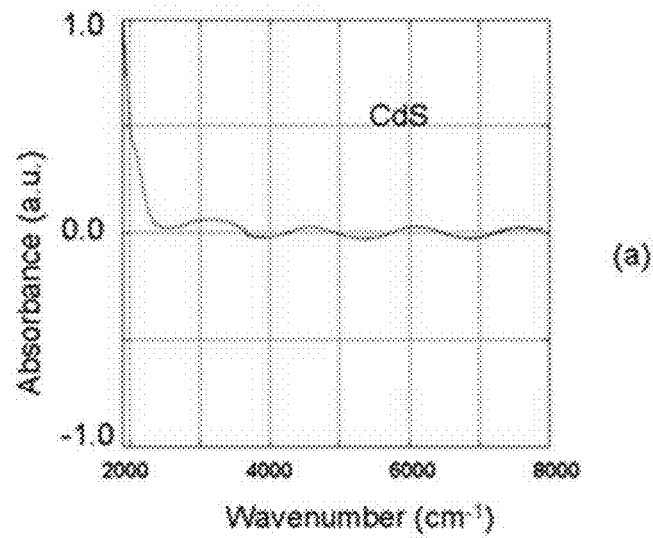
FIGS. 14A-B are graphs illustrating IR absorption spectrum of 50-nm diameter CdS nanowire and IR absorption spectrum of 50-nm diameter CdSe nanowire, respectively.
Figure 14B:
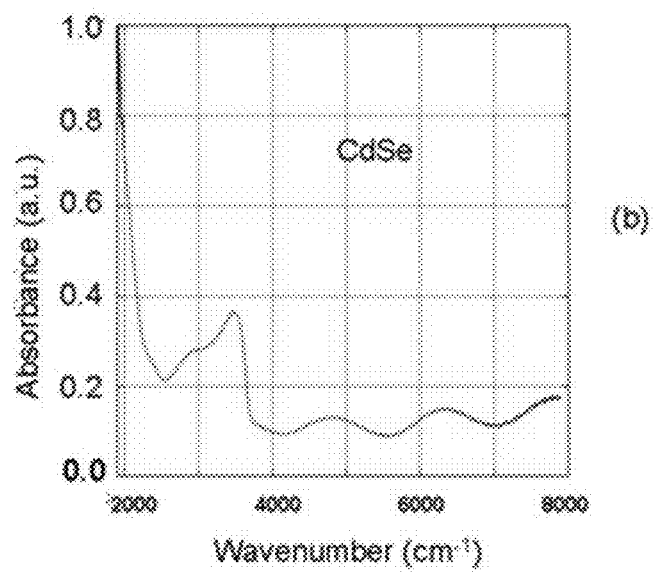

The measured IR absorption spectrum of 50-nm diameter CdS and CdSe nanowires, respectively, is shown in FIGS. 14A and 14B. Here, the infrared spectra are measured with a BOMEM Fourier Transform Infrared Spectrometer with a wavenumber resolution of 5 cm$^{-1}$. As shown, at large wavenumbers, the absorption tails off to near zero and only interference fringes caused by reflections of incident light from the front and back surface of the samples is observed.

Absorption decreases with increasing photon wavenumber (or energy). This is characteristic of nanowires which possess a quasi one-dimensional density of electron and hole states that ideally varies with photocarrier energy E as $1/\sqrt{E}$ in each subband. Since the absorption is non-zero, there must be shallow traps in the bandgap from where infrared photons are exciting electrons into the conduction band.

The absorption is stronger at smaller wavelengths because of the quasi one-dimensional density of states. The absorption strength is proportional to the joint electron-hole density of states. Hence, the observed spectrum is very characteristic of nanowires. Furthermore, since the absorption drops off with increasing photon energy, the IR absorption is mostly due to the nanowires and not the thin layer on the surface (due to overfilling) which will behave either as a two- or a three-dimensional layer that has either energy-independent density of states or density of states that increases with energy as $\sqrt{E}$. The spectrum matches the $1/\sqrt{E}$ dependence only approximately; an exact match would have required the bandstructure of the nanowires to be perfectly parabolic, which is extremely unlikely. This data also shows that there is most likely a dominant trap level, no deeper than 245 meV [k=2000 cm$^{-1}$] from the lowest subband bottom in the conduction band of the nanowires, whence most of the electrons are excited into the conduction band by IR photons. It is noted that the equipment used does not allow for measuring absorption for wavenumbers less than 2000 cm$^{-1}$.

The traps may have a varied origin. They could be caused by dislocations associated with relaxation of strain in the nanowires due to lattice mismatch between the semiconductor and alumina, or interface states. The origin however is not important for this purpose since it plays no role in photodetection.

Figure 15:
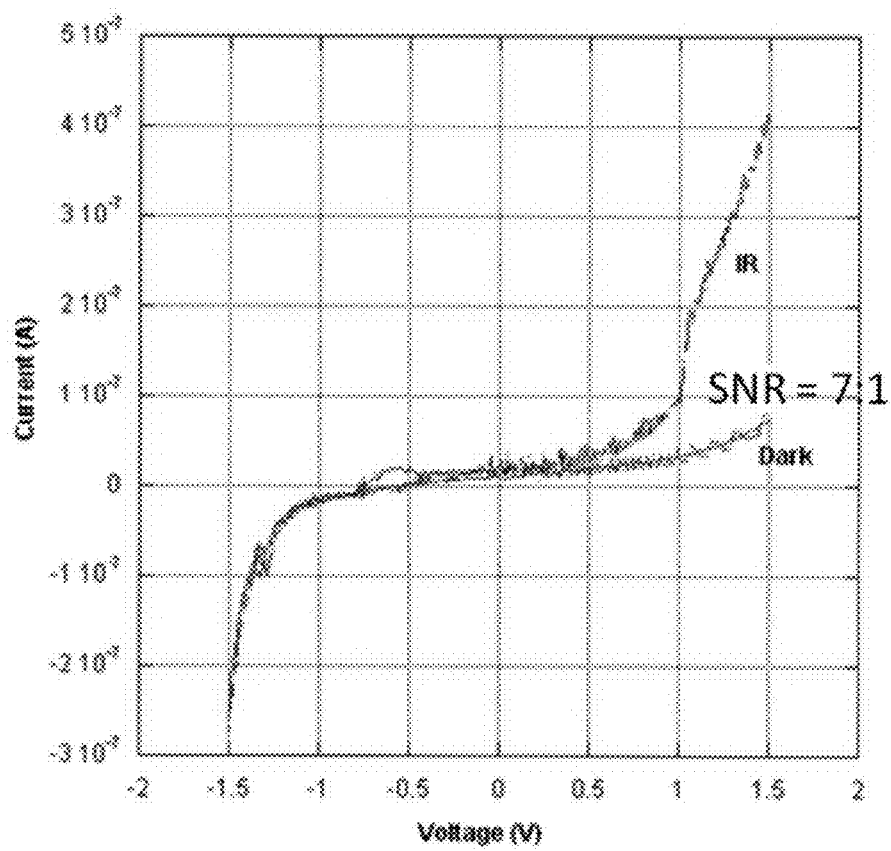
FIG. 15 is a graph illustrating current-voltage characteristic of the tunnel detector in the dark and under IR illumination at room temperature.
Figure 16:
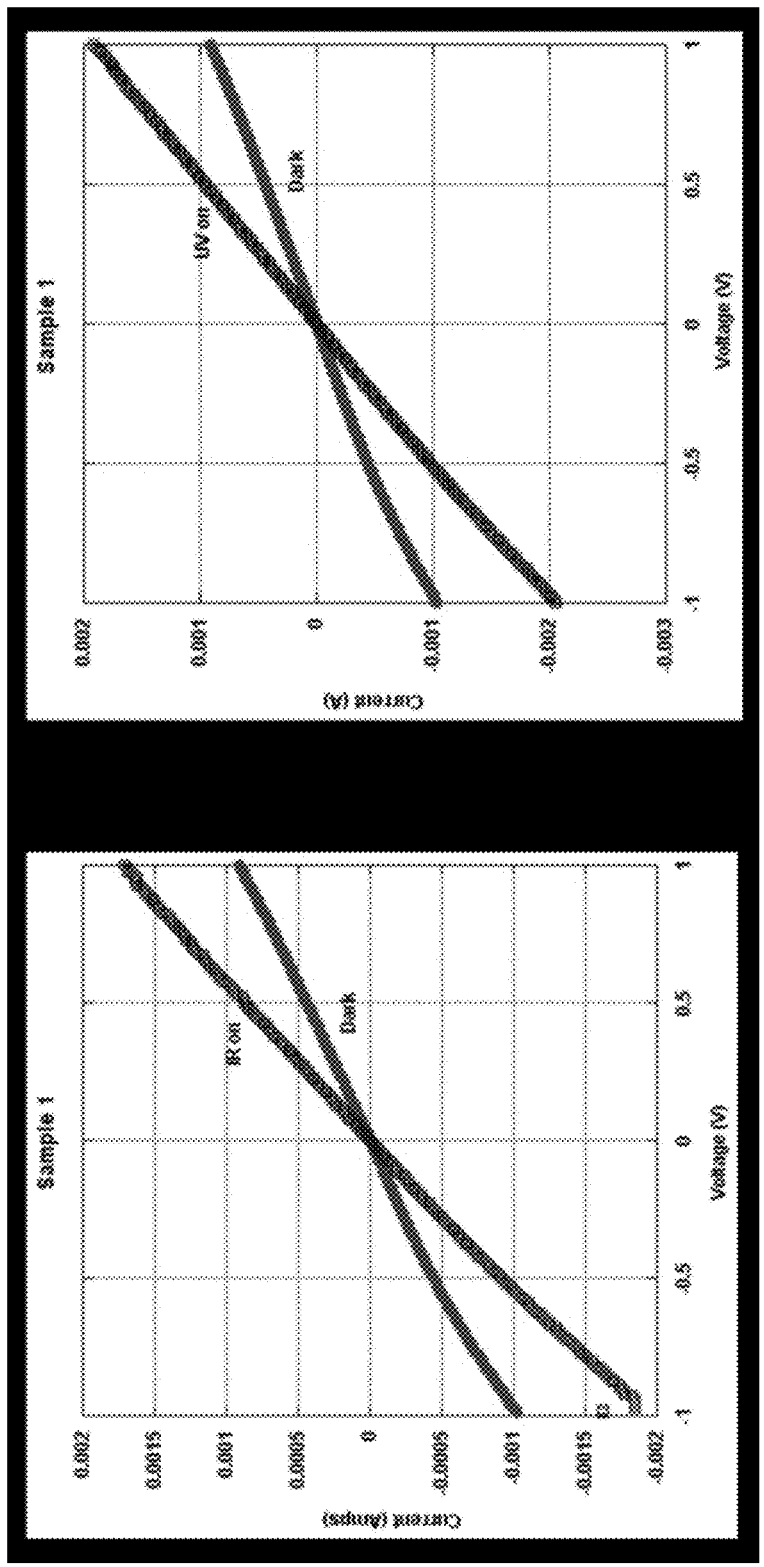
FIGS. 16A-B are graphs of current-voltage the characteristic of 50-nm diameter CdS nanowire photodetectors in dark and under illumination by IR and UV lamp, respectively.

The current versus voltage characteristic of the CdS tunnel detector was measured in the dark and under IR illumination. These results are shown in FIG. 15. The current-voltage characteristic is very non-linear, which is characteristic of tunneling current. Further, the signal to noise ratio is large in forward bias when V>0, and almost unity in reverse bias when V<0. IR radiation increases the current significantly in forward bias, but not in reverse bias, as can be seen with energy band diagrams. The photodetector, however, is fully functional since IR light does increase the current by a factor of 7 at room temperature. In other examples, the I-V characteristics are shown in FIGS. 16A and 16B. More specifically, shown are the measured current-voltage characteristic of 50 nm diameter CdS nanowire photodetectors in the dark and under illumination by an IR lamp of 250 Watts power (FIG. 16A) or under illumination by a UV lamp (FIG. 16B). The ambient temperature is room temperature. As shown, when light is switched on, the characteristics change immediately from the "dark" characteristic to the "light" characteristic and do not drift with time. This further confirms that thermal effects play no role since it will take seconds, if not minutes, for the wires to heat up under light and the characteristics would have drifted during this time. Note that the characteristics are fairly linear showing that the electrical contacts are ohmic. At any given voltage, the current increases roughly by a factor of 2 under illumination, so that the room-temperature SNR is 2:1.

Although time resolved measurements can be made with a pulsed IR source, it is expected that the response time will be roughly the time needed to excite electrons from the trap states into the conduction band. The discharging time of traps in some of the nanowires was measured in the past and was found to be on the order of 2.5 μs. Accordingly, it is expected that the response time under illumination will be of the same order, i.e., a few μs. Most applications of IR detectors are however in the steady-state, for which the response time is immaterial.

The fact that these wide-bandgap nanowires absorb IR light, and the conductivity increases upon absorption, confirms there must be shallow filled trap states in the bandgap from which electrons are being excited into the conduction band by IR photons. Although IR absorption can be due to free-carrier absorption as well, such absorption would not have increased the conductivity since it does not create additional carriers in the conduction band. Moreover, free carrier absorption in nanowires is weak owing to the k-selection rule. It is also possible that IR absorption may be due to excitation of electrons from the valence band into empty trap states close to the valence band, and the holes created in the valence band increased the conductivity. If that were the case, then the Fermi level in the semiconductor would have been below the empty traps, close to the valence band, and the nanowires would have behaved as p-type. Since that is not the case, this possibility can be eliminated and it can be asserted that IR absorption is due to excitation of electrons from filled shallow trap levels in the bandgap into the conduction band. This is explained in more detail below.

The UV absorption spectrum does not show a monotonic trend, but a broad peak around the bandgap frequency due to quasi one-dimensional density of states in 10 nm diameter nanowires. This is the first observation of quasi one-dimensionality in the optical absorption of self-assembled nanowires. More particularly, in FIG. 17, the measured absorption spectrum of CdSe nanowires is shown. The absorption strength does not increase monotonically with photon energy unlike what was observed in past experiments with similarly fabricated nanowires. Instead, it peaks at a photon energy slightly above the bulk bandgap of CdSe. The peak however is very broad with full-width-at-half-maximum (FWHM) of about 1:5 eV. This is not uncharacteristic of electrochemically synthesized nanowires since their photoluminescence spectra also exhibit very broad peaks. The gigantic FWHM is probably due to a number of effects including inhomogeneous broadening and very significant band-tailing. The latter is unavoidable since the nanowires are polycrystalline and not single crystal. Annealing does not re-crystallize the nanowires and does not reduce the line width by much, although in some cases annealing may help. One has to explore a large parameter space to find the right annealing conditions. However, there is no mistaking that there is a clear blue-shift. The blue-shift is 300-430 meV depending on where the band-edge is located. If it is assumed that the absorption peak is due to the 1e-1hh transition involving the highest heavy-hole subband and the lowest electron subband, and furthermore the blue-shift is entirely due to carrier confinement, then an effective diameter of the nanowires that will produce such a blue-shift can be backed out. Based on available data on electron and heavy-hole effective masses in CdSe, the effective diameter will be in the range of about 4.25-5.00 nm, if a hardwall potential is assumed. Surface charges have caused an effective side depletion of 5.0-5.75 nm since the nanowire's nominal diameter is 10 nm. This calculation is however somewhat specious since one cannot be sure that the observed blue-shift is entirely due to carrier confinement. Strain may have contributed and it is unclear what fraction to attribute to strain. All these uncertainties highlight the fact that blue-shifts are not reliable indicators of one-dimensional electron or hole confinement.

Figure 17:
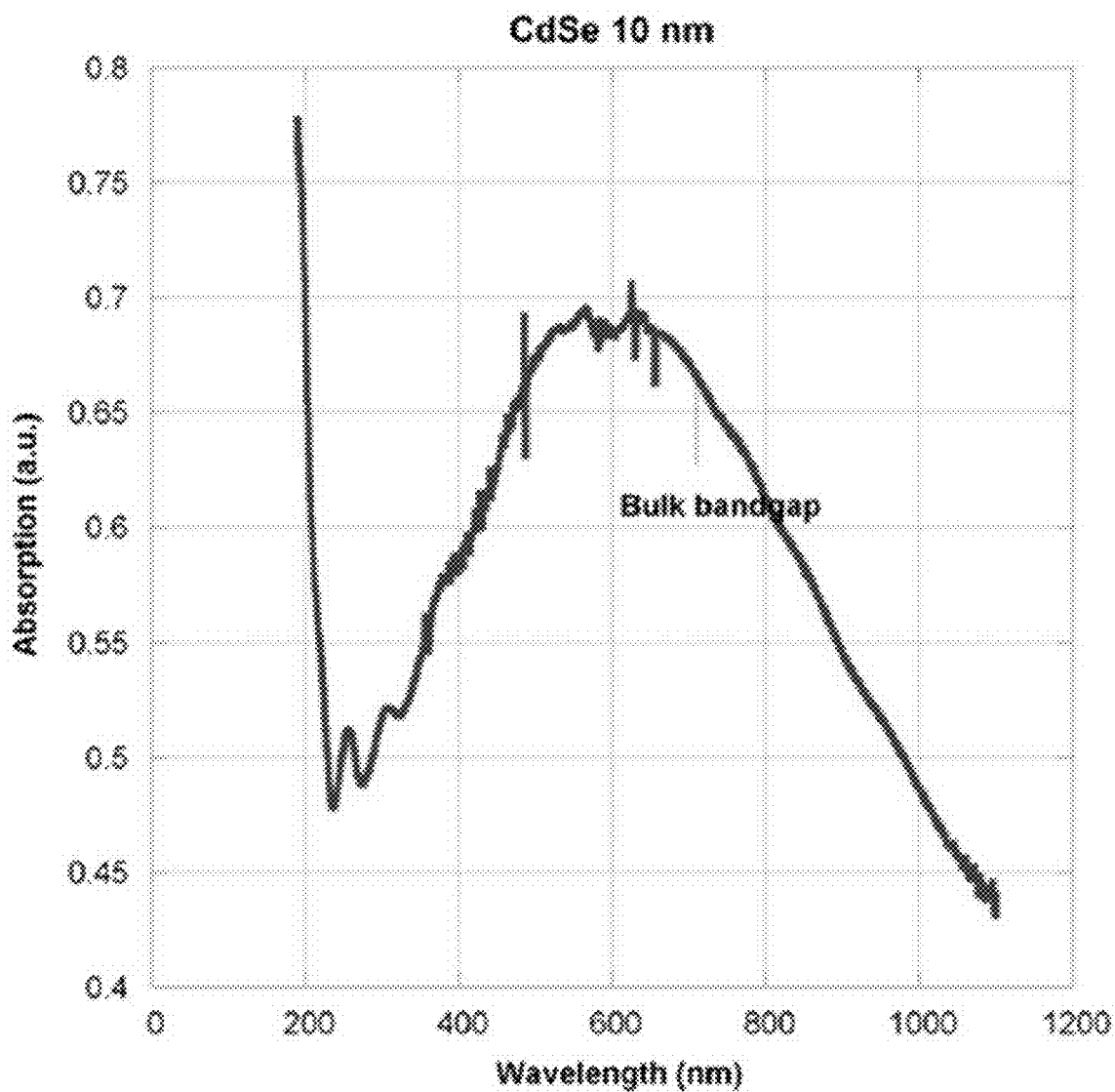
FIG. 17 is a graph illustrating room-temperature absorption spectrum of CdSe nanowires formed within 10-nm diameter pores of anodic alumina films.

Another feature demonstrated by FIG. 17 is that the absorption climbs up steeply for wavelengths shorter than 225 nm (or photon energies larger than 5.48 eV). This is probably caused by real space transfer where carriers are optically excited from the valence band of CdSe to impurity bands in the bandgap of anodic alumina, or even the conduction band of alumina, once the photon energy exceeds 5.48 eV. The matrix element for this transition (indirect in real space) may not be negligible if there are built-in electric fields in the sample due to space charges that causes the wave functions of the holes to leak partially out into the alumina. This increases the overlap between the electron wavefunctions in the alumina and hole wavefunction in the semiconductor nanowire, thereby facilitating real space transfer.

Figure 18:
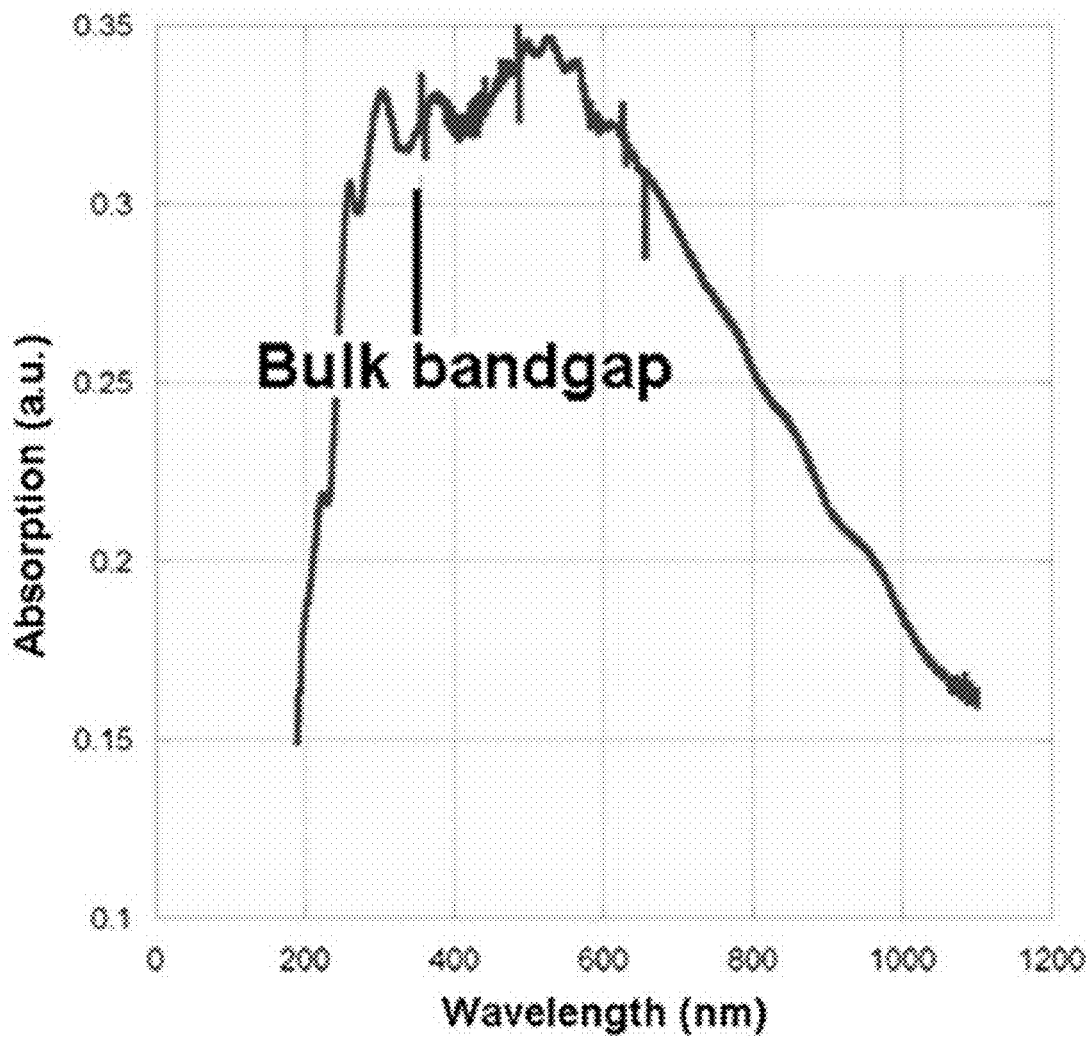
FIG. 18 is a graph illustrating room-temperature absorption spectrum of ZnS nanowires formed within 10-nm diameter pores of anodic alumina films.

FIG. 18 shows the absorption spectrum of two samples of 10 nm diameter ZnS nanowires. In sample 1, the absorption peaks right around the bulk bandgap energy with no significant blue-orred-shift, while in sample 2, there is a significant red-shift. Sample 2 shows an extremely broad peak with an FWHM of about 3 eV. Because the effective mass of electrons in ZnS is 0.4 times the free electron mass and the effective mass of heavy holes is even larger, a large blue-shift is not expected due to quantum confinement in ZnS nanowires, unlike in the case of CdSe which has much smaller effective masses.

On the other hand, strain can produce either a blue-shift or a red-shift depending on the a and b coefficients of the material and whether the strain is compressive or tensile. Thus, there are many possible causes of the observed red-shift in sample 2: (1) strain, (2) bandgap states and band-tailing due to the polycrystalline nature, and (3) Stark effect which reduces the effective bandgap and has been observed before in these types of nanowires. Bandgap states are most likely the cause of the red-shift since the FWHM is extremely large and can only be explained by absorption into numerous bandgap states. Note that here there is no blue-shift expected from quantum confinement (however slight), but instead a red-shift. Most likely, the red-shift is caused by the preponderance of bandgap states. This reinforces the notion that frequency shifts are unreliable indicators of quantum confinement. The feature that is most interesting in FIG. 18 is of course the non-monotonic dependence of absorption strength on photon energy which is not expected in two- or three-dimensional structures and is characteristic of quasi-one-dimensional carrier confinement. This feature is seen in both samples.

Figure 19:
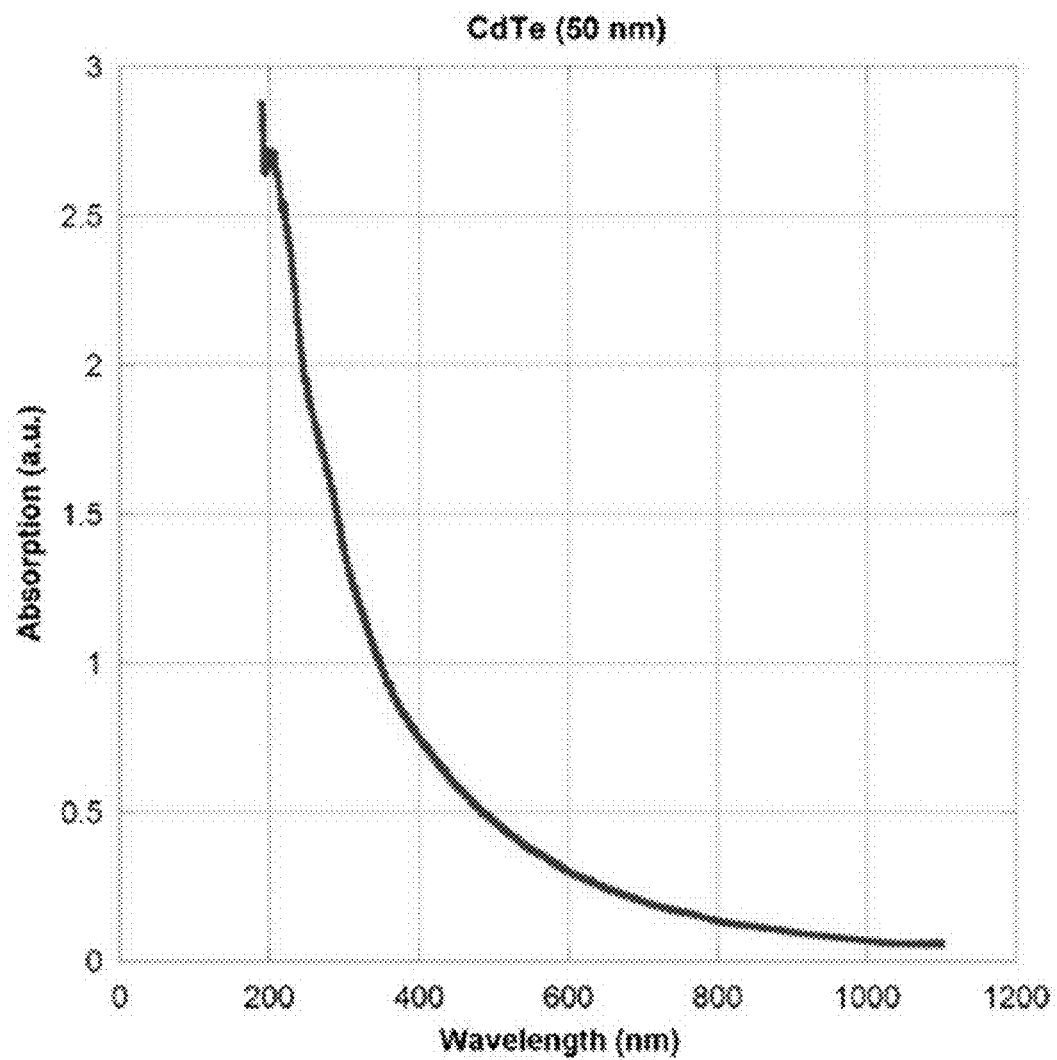
FIG. 19 is a graph illustrating room-temperature absorption spectrum of CdTe nanowire samples.

To determine how narrow a nanowire has to be to behave as a quasi-one-dimensional structure, anodic alumina films with 50-nm diameter pores were prepared by anodizing aluminum in oxalic acid instead of sulfuric acid. Nanowires of nominally 50-nm diameter were then produced by electrodepositing semiconductors in these pores. These CdTe nanowires do not exhibit peaks in their absorption spectra, as shown in FIG. 19. Instead, their absorption increases monotonically with photon energy, showing that they behave as bulk (three-dimensional) structures. Hence only very narrow nanowires meet the criterion of quasi-one-dimensionality. Nanowires with diameters comparable to the thermal De-Broglie wavelength of carriers may be considered quasi-one-dimensional since only in them the energy separation between subbands will exceed the thermal energy kT. In ZnS, the thermal De-Broglie wavelength of electrons is 12 nm, whereas in CdSe it is 21 nm. Thus, nanowires with diameters of 10 nm might qualify as quasi-one-dimensional, but wires with 50 nm diameter will not.

In yet other examples, photoluminescence spectra of 10-nm diameter CdS and 10-nm diameter ZnSe nanowires are taken with a He—Ne laser. The absorption spectra are shown respectively in FIGS. 20A and 20B. This shows that the nanowires are optically active. All spectra show a slight blue-shift from the bulk bandgap peak possibly due to quantum confinement of electrons and holes in the nanowires. However, the blue-shift can also arise from strain in the nanowires because of atomic mismatch with the surrounding insulator.

The energy band diagram for the conduction band of the heterostructure comprising the semiconductor CdS and the insulator alumina is shown in FIGS. 21A and 21B. IR light excites electrons from shallow trap states near the semiconductor's conduction band into the conduction band, which bends the conduction band down. The energy band diagram in the dark is shown in blue and under IR illumination is shown in red. Clearly, the height of the tunnel barrier decreases under illumination in the forward bias case when electrons flow from left to right. This happens because the conduction band bends down (as shown in FIG. 21A) as photons excite electrons from trap levels into the conduction band. In other words, $\Phi_l^f < \Phi_d^f$, where $\Phi_d^f$ and $\Phi_l^f$ are the potential barrier heights in the dark and under illumination, respectively, when the barrier is forward biased. At the same time, the electric field inside the insulator decreases so that $E_l^f < E_d^f$, where $E_d^f$ and $E_l^f$ are the electric fields within the barrier in the dark and under illumination, under forward bias.

From Equation (16), it can be inferred that the transmission probabilities under forward bias conditions (i.e. when $E_{F1} - E_{F2} = eV > 0$) in the dark and under illumination are, respectively, $$|T_{forward}^{dark}(E)| = \exp\left[-\frac{\sqrt{2m^*\Phi_d^f}}{\hbar} W \left\{1 - \frac{1}{4}\frac{eE_d^f W}{\Phi_d^f}\right\}\right] \quad \text{EQ. (18)}$$

$$|T_{forward}^{light}(E)| = \exp\left[-\frac{\sqrt{2m^*\Phi_l^f}}{\hbar} W \left\{1 - \frac{1}{4}\frac{eE_l^f W}{\Phi_l^f}\right\}\right],$$

Note that the inequality $E_d^f > E_l^f$ should make the dark current larder than the light current, but then $\Phi_d^f > \Phi_l^f$, which should make the light current larger. The latter effect is much stronger since the first term within the curly bracket is more than one order of magnitude larger than the second term. Under forward bias, the light current is much larger than the dark current.

When the barrier is reverse-biased (i.e. when $E_{F1} - E_{F2} = eV < 0$), and electrons flow from right to left in the right panel of FIG. 21B, then $\Phi_d^r = \Phi_l^r$ but $E_d^r < E_l^r$. The transmission probabilities are now:

$$|T_{reverse}^{dark}(E)| = \exp\left[-\frac{\sqrt{2m^*\Phi_d^r}}{\hbar} W \left\{1 - \frac{1}{4}\frac{eW_d^r W}{\Phi_d^r}\right\}\right] \quad \text{EQ. (19)}$$

$$|T_{reverse}^{light}(E)| = \exp\left[-\frac{\sqrt{2m^*\Phi_l^r}}{\hbar} W \left\{1 - \frac{1}{4}\frac{eE_l^r W}{\Phi_l^r}\right\}\right],$$

where the superscript "r" refers to reverse-bias conditions. Note that since $E_d^r < E_l^r$, the light current should be larger than the dark current, but this is the minor effect. The major effect is due to the barrier height. Since under reverse bias $\Phi_d^r = \Phi_l^r$, the light current and dark current will be about equal. Thus, the light current will be considerably larger than the dark current in forward bias, leading to a large signal-to-noise ratio, but the two currents will be approximately equal under reverse bias. This is confirmed in the current-voltage characteristic of FIG. 15.

Thus embodiments of the invention provide an IR photodetector whose signal-to-noise ratio at room temperature has been significantly enhanced by exploiting two quantum mechanical principles, namely, wavefunction engineering via trap states and modulation of tunneling probability with light. Such detectors (e.g. 50-nm diameter CdS nanowires) work at room temperature with a signal-to-noise ratio of up to 7:1 under a forward bias of 1.5 V.

In order to calculate the effective detectivity D* of the photodetector at room temperature, proceed as follows: From FIG. 16A, the illuminated conductance of a typical sample is about 1.75 mS. The thermal noise current power spectral density is $S_f=4kTG$, where kT is the thermal energy and G is the conductance. This yields the thermal noise current under illumination as $I_t=\sqrt{(4kTG)}=5$ pA/√Hz at room temperature. The Shot noise current under illumination is $I_s=\sqrt{(2qI)}=24$ pA/√Hz when the voltage bias is 1 V (q=electron charge). Therefore, the total noise current at 1 V bias is $I_n=I_s+I_t=29$ pA/√Hz.

During illumination, the IR lamp is placed at a distance r=4 cm from the sample surface. Therefore, the power incident on the sample's surface per unit area is 250 W/($\pi r^2$)=4.97 W/cm² since the lamp radiates within a solid angle of $\pi$ radians. Even if all surface reflection is neglected and it is assumed that all incident power is absorbed by the detector, the power absorbed is no more than 1.24 Watts since the detector's surface area is 0.5 cm×0.5 cm. Since this absorbed power changes the current in the photodetector by about 0.8 mA at a bias voltage of 1 V, the responsivity R of the detector is 0.8 mA/1.24 W=6.45×10$^{-4}$ A/W at 1 V bias. Therefore, the minimum IR power that the detector can detect in the presence of thermal and Shot noise at room temperature is $I_n$/R=43.4 nW/√Hz when biased at 1 volt. This is the 'noise equivalent power' (NEP).

The minimum IR radiation power that the detector can detect in the presence of noise is called the noise equivalent power (NEP). The smaller it is, the more sensitive is the detector. The unnormalized detectivity is the reciprocal of the noise equivalent power. The larger it is, the more sensitive is the detector.

Effective detectivity D* at room temperature is evaluated from formula $D^*=R(\sqrt{(A)})/I_n$, where A is area of the detector in cm². This yields detectivity in Jones (cm-(√Hz)/W). Using the values of R and $I_n$, $D^*=1.18\times10^7$ Jones at 1 volt bias. This is over an order of magnitude better than as reported in the literature. See P. V. V. Jayaweera, S. G. Matsik, A. G. U. Perera, H. C. Liu, M. Buchanan and Z. R. Wasilewski, Appl. Phys. Lett., 93, 021105 (2008).

While the detectivity is impressive, the SNR and the standby power dissipation are not. The latter quantity is the product of the dark current at a given bias and the bias itself. At 1 V, this quantity is 0.9 mW. In order to improve the SNR and standby power dissipation, slight design change was made whereby the barrier layer separating the nanowires from the underlying aluminum was incompletely removed during the fabrication step. As a result, the photocurrent through the nanowires will have to tunnel through a thin insulating layer. This improved both the SNR and the standby power dissipation—the latter by more than a factor of 1500—while the normalized detectivity decreased by a factor of about 36.

The barrier layer at the bottom of the pores is roughly 20 nm thick and it is ascertained that it takes about 60 minutes of soaking in 5% phosphoric acid to dissolve it completely. Assuming a constant dissolution rate, 45 minutes of soaking will leave behind an approximately 5 nm thick barrier through which electrons can tunnel. Therefore, the samples were prepared as before, except the soaking time was reduced to 45 minutes. This definitely leaves behind a thin barrier layer since the dc electrodeposition time increased considerably at the same dc voltage (minutes to hours). This happened because the dc deposition current reduced considerably. Cross-section SEM characterization can be used to determine definitively the presence and the width of the tunnel barrier with an SEM that provides 5-nm resolution at the low voltages needed to avoid charging up the insulator. The measured current-voltage characteristic, however, changed from linear to non-linear (superlinear) which happens only if carriers either tunnel through the barrier or thermionically emit over it. Since the barrier is obviously too high for thermionic emission, it seems that carriers must be tunneling through it.

The tunnel barrier will reduce both the dark current and the light current at a given bias since it increases the resistance in the path of the current. This will reduce the standby power dissipation. It is expected that it will also increase the SNR because of the following: Without the tunnel barrier, the SNR is approximately:

$$SNR\bigg|_{no\,tunnel\,barrier} \approx \frac{n_{photon}}{n_{phonon}} + 1, \quad \text{EQ. (20)}$$

where $n_{photon}$ is the number of electrons excited into the conduction band by photons and $n_{photon}$ is the number excited by phonons.

Since the measured SNR in the samples without the tunnel barrier is about 2, $n_{photon} \approx n_{phonon}$. In other words, the additional electrons excited into the conduction band by light is roughly equal in number to the electron population excited there in the dark by phonons.

Figure 1:
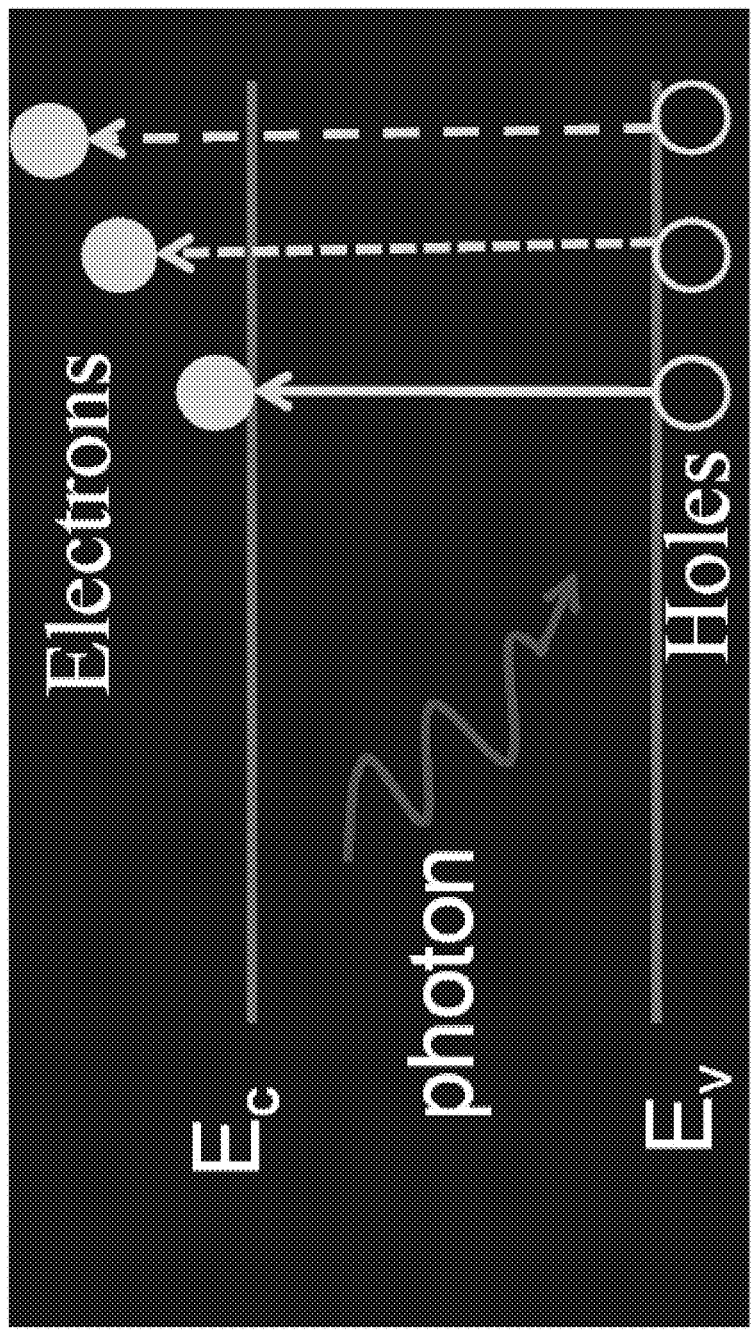
FIG. 1 is a schematic illustration of the principle of photodetection in a semiconductor.
Figure 2:
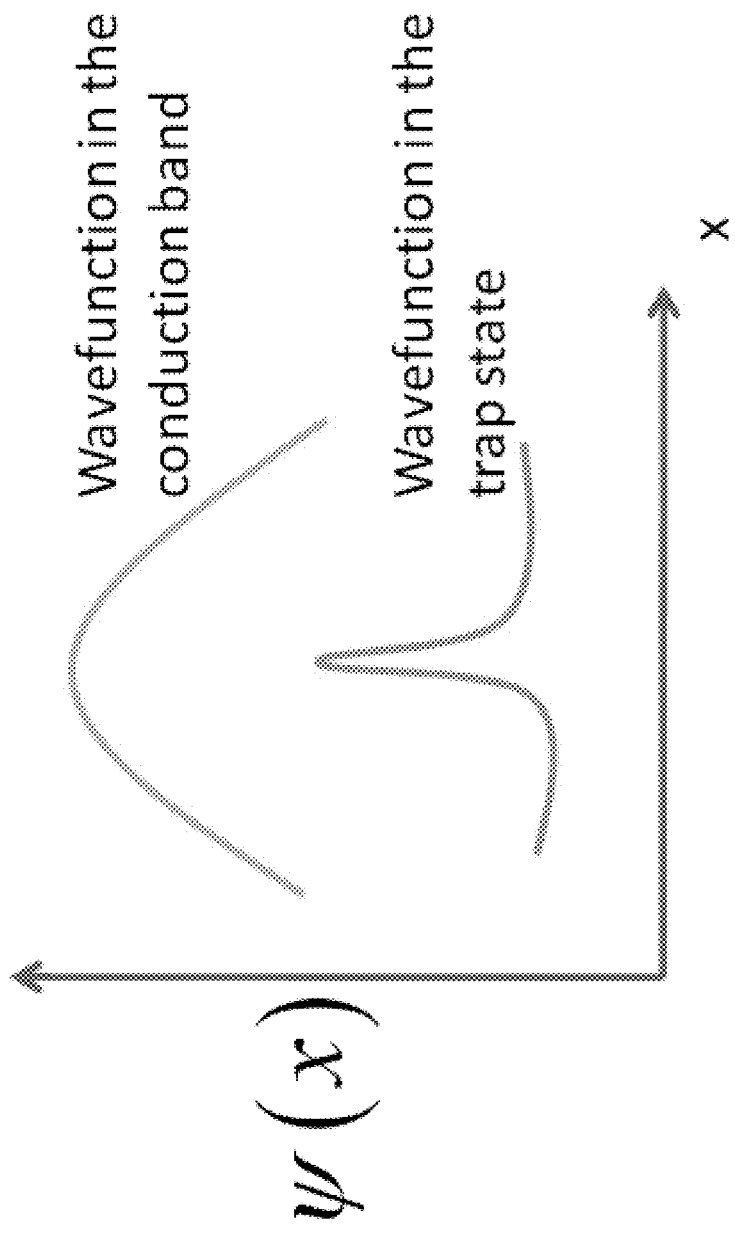
FIG. 2 is a graph of the spatial extents of the wavefunctions in the conduction band and trap states.
Figure 3:
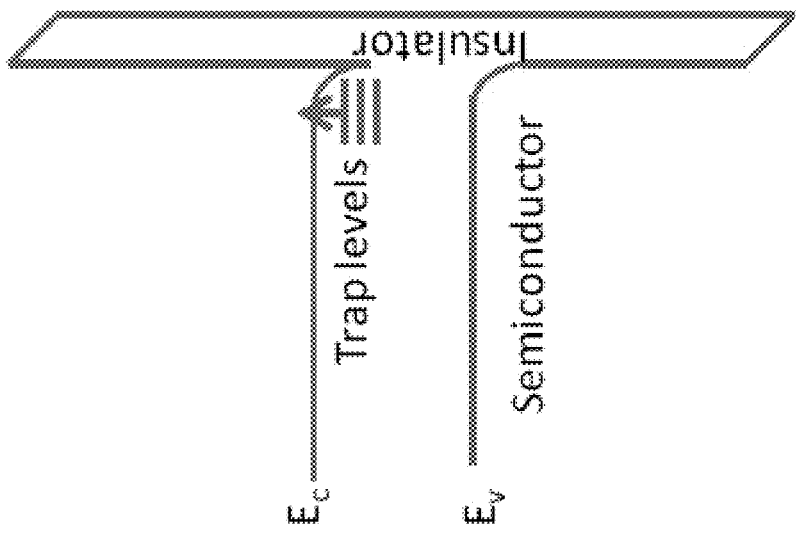
FIG. 3 is a schematic diagram of energy band alignment of a semiconductor and insulator showing the relative energy position of the trap levels.
Figure 4:
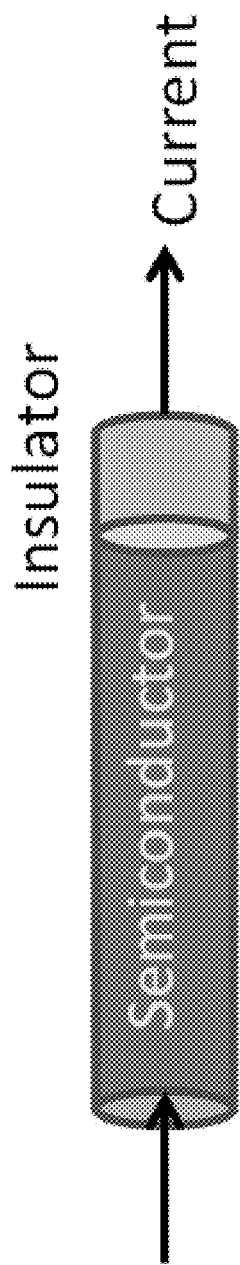
FIG. 4 is a schematic diagram illustrating a semiconductor nanowire tunnel detector according to the invention.
Figure 5:
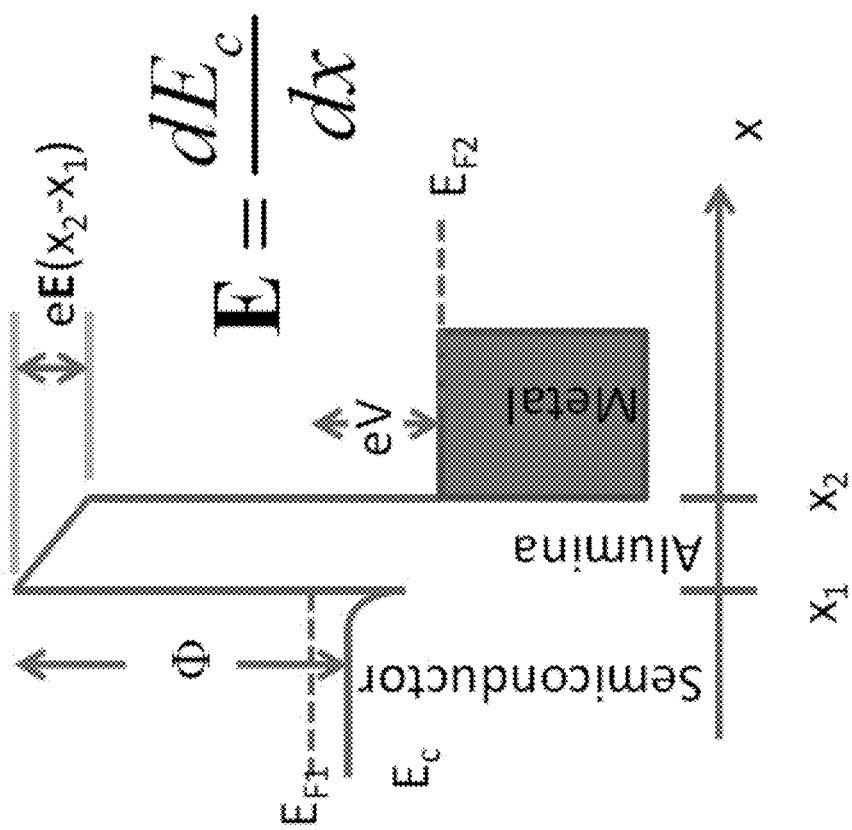
FIG. 5 is a schematic diagram of an electron energy band around the tunnel barrier for the structure shown in FIG. 3.

The SNR of a photodetector with a tunnel barrier however will not be given by Equation (20) because the current will no longer be proportional to the number of electrons in the conduction band. Photo-excitation of electrons from trap states into the conduction band causes the latter to 'bend' because charges accumulate at the interface between the semiconductor and the insulator (tunnel barrier). Under an electrical bias, the energy band diagram in the direction of current flow looks as in FIG. 5. The holes that are created in the valence band because of the repopulation of emptied traps flow out into the contact easily since there is no energy barrier in the valence band. However, the generated electrons that lodge themselves into the conduction band notch at the semiconductor/insulator interface cannot flow out so easily because of the tunnel barrier impeding electron flow. These electrons can flow out only by tunneling through the barrier. With a high barrier, the tunnel rate is small since the tunneling current is small. Therefore, initially, the rate of electron generation in the conduction band due to light will exceed the rate of tunneling out and electrons will begin to accumulate in the notch at the interface between the insulator and the semiconductor. This results in net charge accumulation in the notch which bends the conduction band down in accordance with Poisson equation and reduces the barrier height. The lowering of the barrier increases the tunneling current and the tunnel-out rate. As the band bends down, more trap levels come within one IR photon energy of the conduction band and more electrons can be excited from trap levels into the conduction band by light. This bends the conduction band down further, decreases the barrier height even more, and increases the tunnel current. Note that the tunnel current (and hence the tunnel-out rate) is exponentially sensitive to barrier height and hence increases very rapidly with increasing band bending. Finally, steady-state is achieved when the photogeneration rate and the tunnel-out rate balance. At steady-state, the tunnel barrier height $\Phi'$ under illumination is less than the tunnel barrier height $\Phi$ in the dark because of the additional band bending caused by the photoexcited electrons as shown in FIG. 5. Because of the exponential dependence of the tunneling current on barrier height, which itself depends on the photoexcited electron population, it is expected that the current through the tunnel detector will be very sensitive to light, so that $I_{light} \gg I_{dark}$, resulting in an SNR that will not be given by Equation (20) and will be much larger than 2.

The tunneling current through a barrier with a potential drop V across it is given by the Tsu-Esaki formula:

$$I_{tunnel} = \frac{2\epsilon}{h}\int_0^\infty dE|T(E)|[f(E-E_{F1})-f(E-E_{F2})] \quad \text{EQ. (21)}$$

$$= \frac{2e}{h}\int_0^\infty dE|T(E)|[f(E-E_{F1})-f(E+qV-E_{F1})],$$

where EF1 and EF2 are the Fermi levels on two sides of the barrier. Conservatively, it is assumed that the voltage applied across the sample is dropped entirely across the barrier which, in any case, is the most resistive region. In that event, $E_{F1}-E_{F2}=qV$, where V is the voltage across the sample as shown in FIG. 5 and q is the electron charge. The quantity |T(E)| is the tunneling probability of an electron transmitting through the barrier with kinetic energy E.

According to the Wentzel-Kramers-Brillouin (WKB) approximation:

$$|T(E)| = \exp\left[-\int_{x1}^{x2}\kappa(x)dx\right], \quad \text{EQ. (22)}$$

where κ(x) is the imaginary part of the position-dependent electron wave vector in the barrier and is given by $\kappa(x)=(\sqrt{[2m^*(Ec(x)-E)]})/\hbar$, with m* being the electron's effective mass in the barrier. In the barrier, $E_c(x)-E=\Phi_b-qEx$, where $\Phi_b$ is the height of the tunnel barrier encountered by the electron and E is the electric field in the barrier. Therefore, the integral $$\int_{x1}^{x2}\kappa(x)dx\bigg|_{dark} = \int_{x1}^{x2}\frac{\sqrt{2m^*(\Phi_b - qE_d x)}}{\hbar}dx \quad \text{EQ. (23)}$$

$$= \frac{2}{3}\frac{\sqrt{2m^*}}{\hbar}\frac{1}{qE_d}$$

$$\left[\Phi^{3/2}\left\{1-\left(1-\frac{qE_d W}{\Phi}\right)^{3/2}\right\}\right]$$

$$\int_{x1}^{x2}\kappa(x)dx\bigg|_{light} = \int_{x1}^{x2}\frac{\sqrt{2m^*(\Phi_b - qE_l x)}}{\hbar}dx$$

$$= \frac{2}{3}\frac{\sqrt{2m^*}}{\hbar}\frac{1}{qE_l}$$

$$\left[\Phi'^{3/2}\left\{1-\left(1-\frac{qE_l W}{\Phi'}\right)^{3/2}\right\}\right],$$

where $W=x_2-x_1$, $E_d$ is the electric field in the barrier in the dark and $E_l$ is the electric field in the barrier under illumination. The electric field in the barrier will be spatially invariant as long as there are no fixed charges within the barrier. If there are fixed charges, then $E_d$ and $E_l$ should be interpreted as the spatial averages of the electric field within the barrier.

Expanding the factor $$\left(1-\frac{qEW}{\Phi'}\right)^{3/2}$$

in a binomial series and retaining up to second order terms since $$\frac{qEW}{\Phi'} \ll 1,$$

the result is:

$$|T(E)|_{dark} = \exp\left[-\frac{\sqrt{2m^*\Phi}}{\hbar}W\left\{1-\frac{qE_d W}{\Phi}\right\}\right] \quad \text{EQ. (24)}$$

$$|T(E)|_{light} = \exp\left[-\frac{\sqrt{2m^*\Phi'}}{\hbar}W\left\{1-\frac{qE_l W}{\Phi'}\right\}\right].$$

Note that the second term within the curly brackets is about one order of magnitude smaller than the first term when the bias across the sample is 1.5 V. Even if all of this voltage was dropped across the tunnel barrier, qEW will be 1.5 eV while $\Phi \approx 3$ eV.

Equations (21)-(24) clearly show that the light current will be considerably different from the dark current because $\Phi' < \Phi$.

Again referring to FIG. 15, where the measured current-voltage characteristic of the tunnel detector in the dark and under IR illumination at room temperature is illustrated, it is further noted that there is a difference between the signal-to-noise ratio in forward and reverse bias. For example, the SNR at 1.5 V forward bias is 7:1. There are three features that immediately attract notice. The first is that the SNR is poor in reverse bias when the positive polarity of the battery is connected to nickel, and much better in forward bias when the positive polarity is connected to aluminum. Second, the current-voltage characteristic is no longer linear. Third, the SNR in forward bias has increased to 7:1. In embodiments, photodetectors with an SNR of greater than 1:1 are desired. Photodetectors of the invention can have an SNR ranging for example from between 1:1 to 10:1, such as 2:1, 3:1, 4:1, 5:1, 6:1, 7:1, 8:1, 9:1, or 10:1, especially in the context of 1.5 V forward bias.

The second feature, namely the non-linearity of the current-voltage characteristic is due to the fact that transport is due to tunneling. In this case, it is expected that the current will increase superlinearly with voltage due to the exponential sensitivity of the tunneling probability to barrier height. The third feature, namely the larger SNR was expected because of the foregoing discussion and is indeed observed in forward bias.

All that remains to be explained is the first feature, namely the difference between the SNRs in the forward and reverse bias characteristics. This is demonstrated with the help of FIGS. 21A and 21B, where the energy band diagram is plotted under the two bias conditions. From Equation (24), it follows that:

$$|T(E)|_{dark}^f = \exp\left[-\frac{\sqrt{2m^*\Phi^f}}{\hbar}W\left\{1-\frac{qE_d^f W}{\Phi^f}\right\}\right] \quad \text{EQ. (25)}$$

$$|T(E)|_{light}^f = \exp\left[-\frac{\sqrt{2m^*\Phi'^f}}{\hbar}W\left\{1-\frac{qE_l^f W}{\Phi'^f}\right\}\right]$$

$$|T(E)|_{dark}^r = \exp\left[-\frac{\sqrt{2m^*\Phi^r}}{\hbar}W\left\{1-\frac{qE_d^r W}{\Phi^r}\right\}\right]$$

$$|T(E)|^r_{light} = \exp\left[-\frac{\sqrt{2m^*\Phi^{\prime r}}}{\hbar}W\left\{1-\frac{qE_l^r W}{\Phi^{\prime r}}\right\}\right],$$

where the superscript 'f' refers to forward bias and 'r' to reverse bias.

From FIGS. 21A-B, it clear that $\Phi^{\prime f}>\Phi^{\prime r}$ while $E_d^f>E_l^f$. The former effect should make the light current larger than the dark current, while the latter effect has the opposite influence. However, as noted earlier, the second term within the curly brackets in the equations above is much smaller than the first term, so that the former effect dominates and the light current exceeds the dark current in forward bias. It not only exceeds, but because of the exponential dependence of the tunneling probability on barrier height, it exceeds by a factor of 7. In reverse bias, $\Phi^{\prime r}=\Phi^{\prime r}$ while $E_d^r<E_l^r$. The former effect will cause no change between the light and dark current. The latter will make the light current larger, but it is a minor effect and hence negligible. Hence, the light current and dark current are about equal in reverse bias.

From FIG. 15, at 1.5 V bias, the conductance G of the tunnel detector is $4\times10^{-7}$ A/1.5V=0.266 µS. Hence the thermal noise current $I_t$ at room temperature is 66.7 fA/√Hz. The Shot noise current is $I_s$=357 fA/√Hz when the voltage bias is 1.5 V. Therefore, the total noise current is $I_n$=424 fA/√Hz.

The responsivity of the detector is the light current produced for a given incident light power. The change in the current under illumination is $3.4\times10^{-7}$ A under a radiation power of 1.24 Watts. Therefore, the responsivity for R is 0.274 µA/W in this embodiment. Responsivity of photodetectors of the invention can range from 100-400 nA/W, such as from about 150 nA/W to about 200 nA/W, or from about 250 nA/W to about 300 nA/W, or from about 350 nA/W to 400 nA/W. In preferred embodiments, the responsivity ranges from 210 nA/W to 290 nA/W, or from 220 nA/W to 280 nA/W, or from 230 nA/W to 270 nA/W, such as from about 240 nA/W to 250 nA/W.

The noise equivalent power (NEP) is $I_n$/R=1.54 µW. Therefore, the detectivity is $(\sqrt{A})$/NEP=3.3×10⁵ Jones. Thus, the tunnel detector has a 36 times lower detectivity at room temperature, despite the higher SNR. In embodiments, the detectivity or normalized detectivity of the photodetectors of the invention can range from $1\times10^4$ Jones to $1\times10^8$ Jones, such as from $1\times10^5$ Jones to $1\times10^7$ Jones, or from $1\times10^5$ Jones to $1\times10^6$ Jones. In preferred embodiments, the detectivity is in the range of $2\times10^5$ Jones to $3\times10^7$ Jones. In embodiments, the NEP can be up to 2 µW, such as up to 10 nW, or 20 nW, or 30 nW, or 50 nW, or 100 nW, or 200 nW, or 300 nW, or 400 nW, or 500 nW, or 600 nW, or 700 nW, or 800 nW, or 900 nW, or up to 1 µW, or up to 1.25 µW, or up to 1.5 µW, or up to 1.75 µW, and so on. In the context of this specification, the term "up to" also includes the specified endpoint.

The major advantage of the tunnel detector is however in the standby power dissipation. This quantity is $4\times10^{-7}$ A×1.5V=0.6 µW. Therefore, the standby power dissipation has been reduced from 0.9 mW to 0.6 µW for the same contact area, resulting in a factor of 1500 saving. In preferred embodiments, the standby power dissipation of photodetectors of the invention ranges from 100 nW to 1,000 nW, such as up to 110 nW, or up to 120 nW, or up to 150 nW, or up to 175 nW, or from 200-300 nW, or from 400-500 nW, or from 600-700 nW, or from 800-900 nW and so on.

The figures of merit for various embodiments of the invention can be any combination of parameters or ranges of values specified in this specification. Table I below provides the figures of merit for another photodetector comprising 50-nm diameter CdS nanowires when measured at 1.5 V forward bias.

TABLE I

| Figures of Merit | |
|---|---|
| Noise equivalent power (NEP) | 20 nW |
| Responsivity | 209 nA/W |
| Normalized detectivity | $2.5 \times 10^7$ Jones |
| Signal to noise ratio (at 1.5 V forward bias) | 7:1 |
| Standby power dissipation | 120 nW |
| Response time | few µs |

As demonstrated, the inventors provide novel nanowire-based room-temperature infrared photodetectors that rely on excitation of electrons from shallow trap states in the bandgap into the conduction band. This mechanism results in an acceptable signal-to-noise ratio of greater than 1:1, such as up to 10:1. The measured detectivity of this detector exceeds that of other comparable room-temperature detectors by a factor of about 10. The signal to noise ratio and the standby power dissipation can be improved—the latter vastly—by integrating the nanowires with a tunnel detector, while sacrificing some of the high detectivity. These detectors are inexpensive and rugged and are mass producible since they are fabricated with electrochemical self assembly.

The present invention has been described with reference to particular embodiments having various features. One skilled in the art will recognize that these features may be used singularly or in any combination based on the requirements and specifications of a given application or design. For example, with respect to particular methods disclosed herein it is understood that any one or more of the method steps can be omitted, added to another method, or performed in a different order than disclosed. Other embodiments of the invention will be apparent to those skilled in the art from consideration of the specification and practice of the invention. Where a range of values is provided in this specification, each value between the upper and lower limits of that range is also specifically disclosed. The upper and lower limits of these ranges may independently be included or excluded in the range as well, unless otherwise indicated. All numbers and ranges disclosed above may vary by some amount. As used in this specification, the singular forms "a," "an," and "the" include plural referents unless the context clearly dictates otherwise. While compositions and methods are described in terms of "comprising," "containing," or "including" various components or steps, the compositions and methods can also "consist essentially of" or "consist of" the various components and steps.

The references cited in this disclosure are each hereby incorporated by reference herein in their entireties, especially for information that is well known in the art for example with respect to semiconductors. If there is any conflict in the usages of a word or term in this specification and one or more patent or other documents that may be incorporated herein by reference, definitions consistent with this specification should be adopted.

The invention claimed is:

1. A photodetector comprising:
   an array of semiconductor nanowires either standing vertically on a conducting substrate and capped by a conductor transparent to light, or lying horizontally on a non-conducting substrate and capped by conductors at both ends; and wire leads attached to the conductors and conducting substrate for connection to an electrical circuit;

wherein an insulating layer is disposed between the semiconductor nanowires and one of the conductors or the conducting substrate at one end.

2. The photodetector of claim 1, wherein the semiconductor nanowires have a diameter in the range of 5-50 nm.

3. The photodetector of claim 1, wherein the semiconductor nanowires comprise any direct bandgap semiconductor of bandgap energy between 0.3 eV and 4 eV or direct bandgap insulator of bandgap between 4 and 10 eV.

4. The photodetector of claim 1 wherein the nanowires are fabricated by self-assembly, or nanolithography, or combinations thereof.

5. The photodetector of claim 1, wherein the insulating layer is alumina of thickness ranging from above 0 to 20 nm.

6. The photodetector of claim 1, wherein the insulating layer during use acts as a tunnel barrier through which electrons excited by IR, visible or UV light into the conduction band will have to tunnel.

7. The photodetector of claim 1, which during use is capable of detecting IR, UV, or IR and UV light.

8. The photodetector of claim 1, which during use is capable of an infrared detectivity at room temperature ranging from $1 \times 10^5$ Jones to $1 \times 10^8$ Jones.

9. The photodetector of claim 1, which during use and when exposed to IR light, electrons in the semiconductor nanowires are excited from trap states to the conduction band and when exposed to visible or UV light, electrons are excited from valence to conduction band.

10. The photodetector of claim 1, which during use and when exposed to IR, visible or UV light, electrons are excited into the conduction band from either trap states or the valence band; said electrons lower tunnel barrier height and increase current, leading to detection of IR, visible or UV light.

11. The photodetector of claim 1, wherein the insulator layer is a tunnel barrier that during use introduces resistance in the path of the current thus reducing the dark current.

12. The photodetector of claim 1, wherein the tunnel barrier during use introduces resistance in the path of the current thus reducing standby energy dissipation.

13. The photodetector of claim 1, wherein the photodetector is configured to excite electrons during use from a state with localized wavefunction to a state with delocalized wavefunction.

14. A method of making a photodetector comprising:

providing an aluminum foil with a thickness between 0-1 mm;

degreasing and electropolishing the foil to reduce surface roughness;

optionally rinsing the foil in distilled water;

anodizing the aluminum foil in sulfuric, oxalic or phosphoric acid to create a nanoporous alumina film, with columnar pores on a surface of the aluminum foil;

stripping off the alumina film using hot chromic/phosphoric acid;

repeating the anodizing until an alumina film with a desired thickness is obtained;

removing or reducing thickness of any alumina barrier present between the aluminum foil and the bottom of the pores using step anodization, reverse polarity etching, soaking in phosphoric acid, or combinations thereof;

depositing semiconductor material into at least some of the columnar pores to obtain an array of semiconductor nanowires vertically disposed with respect to the aluminum foil;

depositing a layer of optically transparent conductive material on top of the alumina film; and attaching wire leads to the layer of optically transparent conductive material and the aluminum substrate.

15. A photodetector comprising:

an array of semiconductor nanowires standing vertically within an insulating material on a conducting substrate and capped by a conductor transparent to light; and wire leads attached to the conductor and conducting substrate for connection to an electrical circuit;

wherein ends of the nanowires are separated from the conducting substrate by an insulating layer of thickness between 0 and 20 nm.

16. The photodetector of claim 15, wherein during use and when exposed to IR light, electrons in the semiconductor nanowires are excited from trap states in the bandgap to the conduction band, and when exposed to visible or UV light, electrons are excited from the valence to the conduction band, to produce a photocurrent.

17. The photodetector of claim 16, which during use is capable of detecting both IR light and visible/UV light.

18. The photodetector of claim 15, which during use is capable of an infrared detectivity at room temperature ranging from $1 \times 10^5$ Jones to $1 \times 10^8$ Jones.

19. The photodetector of claim 15, wherein the insulating layer is a tunnel barrier through which during use electrons excited into the conduction band of the nanowires by IR, visible or UV light tunnel into the conducting substrate to produce photocurrent that enables detection of IR, visible or UV light.

20. The photodetector of claim 19, wherein the photocurrent during use is sensitive to the intensity of incident IR, visible or UV light since the number of electrons excited into the conduction depends on the intensity and the tunneling photocurrent depends superlinearly on the number of excited electrons.

21. The photodetector of claim 19, wherein the insulator layer is a tunnel barrier that during use introduces resistance in the path of the current thus reducing the dark current.

22. The photodetector of claim 19, wherein during use the tunnel barrier introduces resistance introduced in the path of the dark current thus reducing standby energy dissipation and prolonging battery life.

* * * * *